(12) United States Patent
Okabe et al.

(10) Patent No.: US 8,657,346 B2
(45) Date of Patent: Feb. 25, 2014

(54) LID OPENING/CLOSING SYSTEM FOR CLOSED CONTAINER

(75) Inventors: Tsutomu Okabe, Tokyo (JP); Toshihiko Miyajima, Tokyo (JP); Hiroshi Igarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 849 days.

(21) Appl. No.: 12/624,579

(22) Filed: Nov. 24, 2009

(65) Prior Publication Data

US 2010/0133270 A1    Jun. 3, 2010

(30) Foreign Application Priority Data

Nov. 28, 2008 (JP) ................ 2008-304392

(51) Int. Cl.
*E05C 1/06* (2006.01)
*B65D 85/00* (2006.01)

(52) U.S. Cl.
USPC .......... 292/144; 292/9; 292/23; 292/41; 292/193; 292/DIG. 11; 292/DIG. 25; 414/411; 206/710

(58) Field of Classification Search
USPC .......... 414/217, 217.1, 411, 940; 292/2–4, 9, 292/14–16, 23, 32, 33, 38, 39, 41, 73–77, 292/137, 138, 142, 144, 156, 157, 159, 160, 292/163, 164, 172, 174, 179, 193, 256.5, 292/DIG. 11, DIG. 25, DIG. 55; 70/77–82, 70/158, 163, 164, 275, 277, 278.1, 280; 206/454, 710, 711; 220/315, 324

See application file for complete search history.

(56) References Cited

U.S. PATENT DOCUMENTS

| | | | | |
|---|---|---|---|---|
| 1,054,112 A | * | 2/1913 | Handschuh | 292/144 |
| 4,455,552 A | * | 6/1984 | Greiner et al. | 340/543 |
| 4,665,727 A | * | 5/1987 | Uyeda | 70/279.1 |
| 4,887,445 A | * | 12/1989 | Beatty | 70/278.7 |
| 4,995,430 A | * | 2/1991 | Bonora et al. | 141/98 |

(Continued)

FOREIGN PATENT DOCUMENTS

| | | |
|---|---|---|
| JP | 11-513006 | 11/1999 |
| JP | 2001-77177 | 3/2001 |

(Continued)

OTHER PUBLICATIONS

U.S. Appl. No. 13/041,786, filed Mar. 7, 2011, Igarashi, et al.

(Continued)

*Primary Examiner* — Carlos Lugo
*Assistant Examiner* — Alyson M Merlino
(74) *Attorney, Agent, or Firm* — Oblon, Spivak, McClelland, Maier & Neustadt, L.L.P.

(57) ABSTRACT

The FIMS system is for use with a pod composed of a lid having an engaged portion provided on the outer surface thereof and a pod body having a latch mechanism including an engagement portion that engages the engaged portion as it moves along a predetermined axis to fix the lid to the pod. The FIMS system has a latch mechanism drive means for driving the latch mechanism along a certain axis and an engagement portion position sensor that can generate a signal indicating whether the engagement portion is at an engagement position or non-engagement position when the latch mechanism drive means drives the latch mechanism. The latch mechanism drive means and the engagement portion position sensor are provided in the vicinity of a first opening portion of the FIMS system.

14 Claims, 18 Drawing Sheets

(56) References Cited

U.S. PATENT DOCUMENTS

| | | | | |
|---|---|---|---|---|
| 5,820,234 | A * | 10/1998 | Capwell et al. | 312/216 |
| 6,082,951 | A * | 7/2000 | Nering et al. | 414/217.1 |
| 6,086,121 | A * | 7/2000 | Buckland | 292/34 |
| 6,106,213 | A * | 8/2000 | Denker | 414/411 |
| 6,186,331 | B1 * | 2/2001 | Kinpara et al. | 206/711 |
| 6,186,723 | B1 * | 2/2001 | Murata et al. | 414/217 |
| 6,338,604 | B1 * | 1/2002 | Okabe et al. | 414/217.1 |
| 6,398,475 | B1 * | 6/2002 | Ishikawa | 414/217 |
| 6,430,802 | B1 * | 8/2002 | Miyajima | 29/464 |
| 6,470,927 | B2 * | 10/2002 | Otaguro | 141/98 |
| 6,622,883 | B1 * | 9/2003 | Wu et al. | 220/323 |
| 6,641,349 | B1 * | 11/2003 | Miyajima et al. | 414/217 |
| 6,681,604 | B1 * | 1/2004 | Samsel | 70/78 |
| 6,817,822 | B2 * | 11/2004 | Tokunaga | 414/217 |
| 6,984,097 | B1 * | 1/2006 | Saeki et al. | 414/411 |
| 6,984,839 | B2 * | 1/2006 | Igarashi et al. | 250/559.33 |
| 7,108,135 | B2 * | 9/2006 | Park | 206/711 |
| 7,147,424 | B2 * | 12/2006 | Weaver | 414/684.3 |
| 2004/0119592 | A1 * | 6/2004 | Hahn et al. | 340/545.6 |
| 2006/0117820 | A1 * | 6/2006 | Lanigan et al. | 70/279.1 |
| 2007/0151619 | A1 | 7/2007 | Okabe | |
| 2007/0151620 | A1 | 7/2007 | Okabe | |
| 2008/0022730 | A1 * | 1/2008 | Dietrich et al. | 70/158 |
| 2008/0206028 | A1 * | 8/2008 | Nagata | 414/411 |
| 2009/0035099 | A1 | 2/2009 | Okabe et al. | |
| 2009/0245978 | A1 * | 10/2009 | Okabe | 414/217 |
| 2009/0245981 | A1 * | 10/2009 | Miyajima et al. | 414/222.02 |
| 2010/0059408 | A1 * | 3/2010 | Igarashi et al. | 206/710 |
| 2010/0117377 | A1 * | 5/2010 | Okabe et al. | 292/159 |
| 2011/0210042 | A1 * | 9/2011 | Okabe et al. | 206/710 |
| 2011/0215028 | A1 * | 9/2011 | Igarashi et al. | 206/710 |

FOREIGN PATENT DOCUMENTS

| | | |
|---|---|---|
| JP | 3417821 | 4/2003 |
| JP | 2010087455 A * | 4/2010 |
| JP | 2010118385 A * | 5/2010 |
| JP | 2011035419 A * | 2/2011 |
| JP | 2011151417 A * | 8/2011 |
| JP | 2011181561 A * | 9/2011 |
| JP | 2011187615 A * | 9/2011 |
| JP | 2011187866 A * | 9/2011 |
| WO | WO 97/02199 | 1/1997 |

OTHER PUBLICATIONS

U.S. Appl. No. 13/035,335, filed Feb. 25, 2011, Okabe, et al.
U.S. Appl. No. 13/035,425, filed Feb. 25, 2011, Okabe, et al.
Japanese Office Action issued Oct. 18, 2010, in Patent Application No. 2008-304392 (with English-language translation).
U.S. Appl. No. 12/773,368, filed May 4, 2010, Okabe.

* cited by examiner

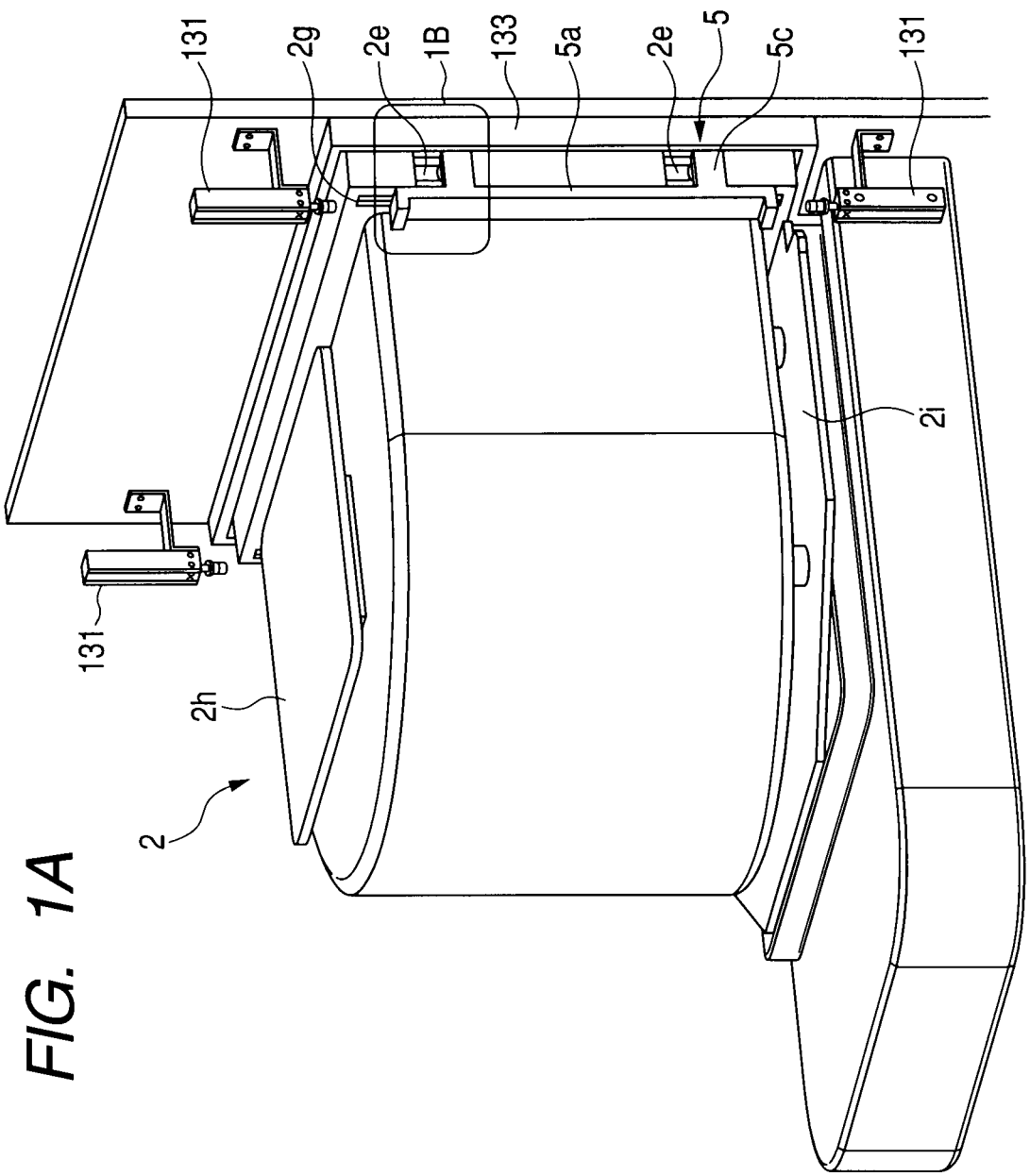

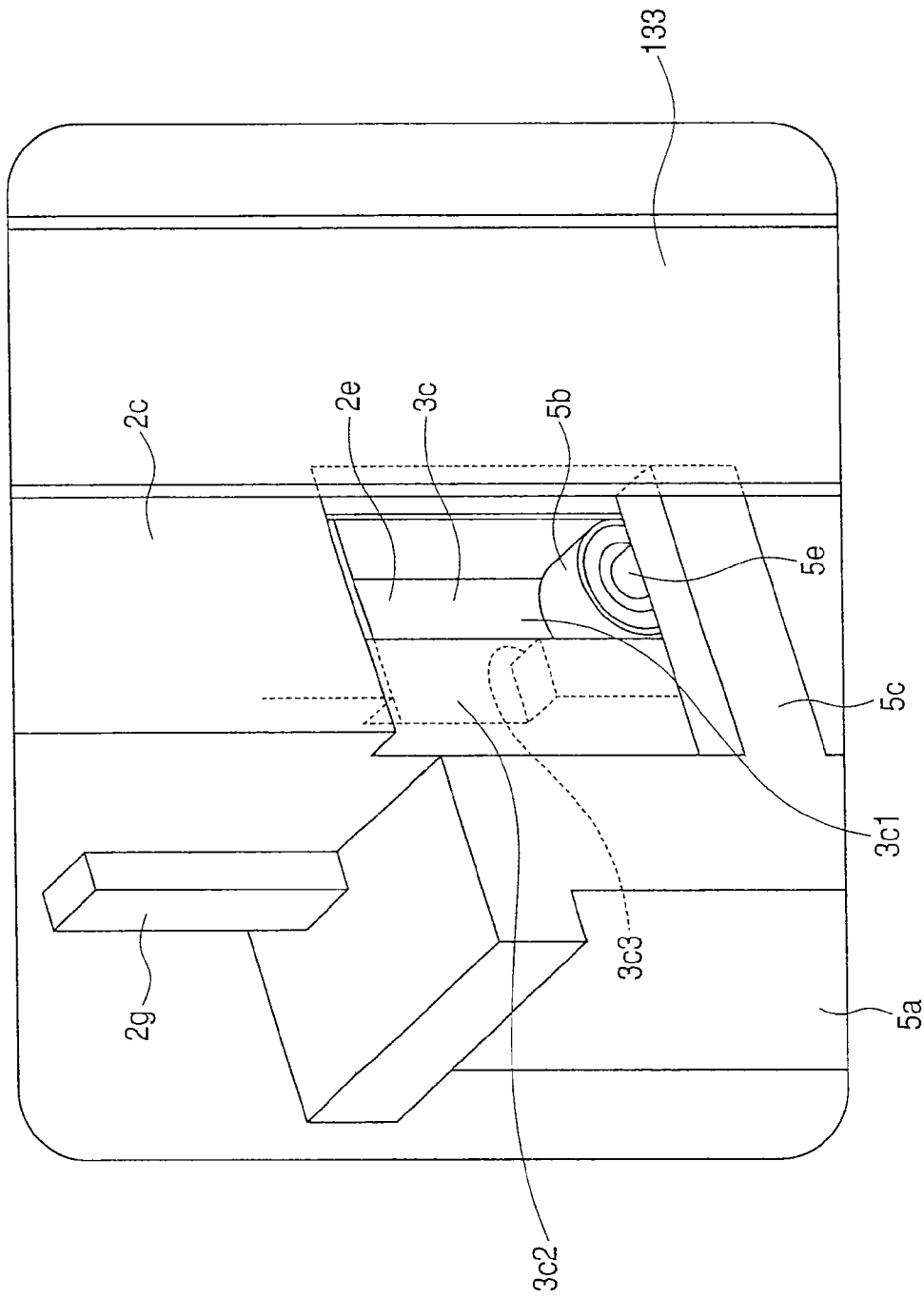

LID OPENING/CLOSING SYSTEM FOR CLOSED CONTAINER

This Application claims priority from Japanese Patent Application No. 2008-304392 filed on Nov. 28, 2008, which is hereby incorporated by reference herein.

BACKGROUND OF THE INVENTION

1. Field of the Invention

The present invention relates to what is called a FIMS (Front-Opening Interface Mechanical Standard) system that is used when wafers stored in the interior of a transfer container called a pod are transported between semiconductor processing apparatuses in a semiconductor manufacturing process etc. More specifically, the present invention relates to a lid opening/closing system or a FIMS system that opens and closes a lid of a pod or a closed container called FOUP (Front-Opening Unified Pod) for storing wafers used with the FIMS system and transfers wafers into/out of the pod.

2. Description of the Related Art

In semiconductor manufacturing processes performed in recent years, only the interior of a processing apparatus, the interior of a pod (storage container for wafers) and a mini-environment through which transfer of substrates or wafers from the pod to the processing apparatus is performed are kept in a highly clean state, and the degree of cleanness of the other spaces is maintained at a certain level. The pod is composed of a substantially cubical body having shelves provided therein that can hold a plurality of wafers in a parallel and separated state and an opening provided on one side thereof through which wafers can be brought into/out of it, and a lid for closing the opening. Those pods which have an opening provided not on the bottom but on one lateral side thereof (i.e. the side to be directly opposed to the mini-environment) are collectively called FOUP.

A structure that defines the above mentioned mini-environment has a opening portion to be opposed to the opening of the pod, a door that closes the opening portion, another processing apparatus side opening portion provided on the semiconductor processing apparatus side of the structure, and a transferring robot that is adapted to reach into the interior of the pod through the opening portion to pick up a wafer and transfer it into the processing apparatus through the other opening portion on the processing apparatus side. The structure that defines the mini-environment further has a support table that supports the pod in such a way that the pod opening is placed just in front of the door. On the top surface of the support table are provided positioning pins to be fitted into positioning holes provided on the bottom surface of the pod to regulate the placement position of the pod and a clamp unit for engaging a clamped portion provided on the bottom surface of the pod to fix the pod to the support table. Typically, the support table is adapted to be movable toward and away from the door over a predetermined distance. When the wafers in a pod are to be transferred into the processing apparatus, the pod placed on the support table is moved until the lid of the pod abuts the door, and then after abutment, the lid is detached from the opening of the pod by the door. By these operations, the interior of the pod and the interior of the processing apparatus are bought into communication with each other through the mini-environment to allow wafer transferring operations that will be performed repeatedly. All of the support table, the door, the opening portion, a mechanism for opening and closing the door and a wall partly defining the mini-environment and having the opening collectively constitute what is called a FIMS system mentioned above.

The lid of a conventional pod is provided, for example, with tongues that are extendable/retractable outwardly beyond/into the outer periphery of the lid so that the pod body and the lid are brought into an engaging state and a disengaged state by extension and retraction of the tongues, as described in detail in Japanese Patent Application Laid-Open No. 2001-077177. Extension and retraction of the tongues are performed by fitting a so-called key member into an operated portion that is linked with the tongues and disposed at a certain position in the central area of the lid, from the outside of the front surface of the lid. Such contact, rotation and sliding etc. of this member generate dust that should be generally taken care of in the semiconductor manufacturing process. However, the dust is brought into the mini-environment in which downward air flow is present before diffused from the small gap between the surface of the lid and the surface of the door to the exterior of the gap. Therefore, the amount of dust diffused into the mini-environment or the pod is not so much that it is regarded as problem, and no countermeasure to such dust has been taken. The pod is transferred in a space in which the degree of cleanness is relatively low. Therefore, dust adheres to the outer surface of the pod body and to the surface of the lid in that space, and substances, such as for example hydrocarbon, contained in the atmospheric air is adsorbed on these surface. It has been considered that such dust and substances are also favorably removed by the effect of downward air flow as with the above-described dust generated by the key member etc.

Improvement in the performance of semiconductor devices and reduction in the size of semiconductor devices have be progressively made. Accordingly, the width of wiring and design rules etc. used in devices have been narrowed, and it has become necessary to take care of smaller size dust particles that did not matter before. Such very small dust particles move in a space due to Brownian motion or influence of weak electrostatic forces. Such motions of very small dust particles are different from those of the dust particles for which countermeasures have conventionally been taken. More specifically, even if the above described downward air flow is supplied with a view to move such very small dust particles down in the mini-environment and to expels them to the exterior space, there is a possibility that dust particles are not simply moved by the air flow but float into the mini-environment. Japanese Patent No. 3417821 discloses a structure in which swing levers are provided outside the opening of the pod instead of tongues provided on the lid, and the lid is pressed down by the levers from the outer surface side of the lid in the state in which the opening is closed by the lid. In this structure, dust like that generated by the key member in the structure disclosed in Japanese Patent Application Laid-Open No. 2001-077177 is generated in the periphery of the opening, and diffusion of dust from the lid and the door that holds the lid may be reduced as compared to the structure disclosed in Japanese Patent Application Laid-Open No. 2001-077177. However, since it is necessary to operate the levers in advance before the operation of opening/closing the lid, and the structure for this operation is provided in the vicinity of the opening, there is a possibility that very small dust particles existing in the outer space are diffused into the mini-environment.

When the pod opening is closed by the lid, the tongues provided on the lid may sometimes fail to be inserted precisely into receiving holes provided on the pod due to the presence of a foreign matter(s) between the opening and the lid or a positional displacement resulting from accumulation of errors such as a positional error of the pod on the support table and an operation error of the door etc. In such cases, if it is mistakenly determined that the pod opening is completely closed by the lid, subsequent operations such as transportation of the pod will be performed, and the lid may be dislocated or detached from the pod, for example, during transportation of the pod. The size of the pod for storing wafers has been made larger with an increase in the diameter of wafers in recent years. In the case of a large size pod, the size of the engaging portion of the tongue is necessarily small in relation to the size of the pod. Therefore, it is considered that the possibility of occurrence of a failure in closing will increase, or there will be cases where an operation error of the tongues cannot be detected even when a failure in closing occurs.

SUMMARY OF THE INVENTION

The present invention has been made in view of the above-described situations, and has an object to provide a lid opening/closing system adapted for use with a pod or closed container that is prevented from being affected by very small dust particle adhering to the surface of the lid that closes the pod opening, and in which generation of dust during the operation of opening or closing the lid and diffusion of dust thus generated into a mini-environment or the interior of the pod are controlled. Another object of the present invention is to provide a lid opening/closing system for a closed container in which when it is used for a pod for storing large diameter wafers, it is verified that the latch pieces of the lid is engaging reliably with the pod in the operation of attaching the lid to the pod to close the opening, and the detachment of the pod from the FIMS is allowed after the verification.

To achieve the above object, according to the present invention, there is provided a lid opening/closing system for a closed container including a lid having a flat plate-like shape and having an engaged portion, a container body having an opening to be closed by the lid and an interior space that opens at the opening, and a latch mechanism including a latch main body that can slide along an axis relative to the container body and an engagement portion that projects from the latch main body and can engage with the engaged portion, for fixing the lid to the container body by the engagement of the engagement portion with the engaged portion, the system being adapted to fix the lid to the closed container by causing the latch mechanism to move along the axis and comprising: a housing that defines a mini-environment having an opening portion; a door that can move between a position at which it substantially closes the opening portion and a position at which it leaves the opening portion open, and can hold the lid; latch mechanism drive means that can operate the latch mechanism when the closed container is at a position at which opening and closing of the lid by the door is performed, the latch mechanism drive means being disposed in the vicinity of the opening portion outside the housing; and an engagement portion position detection sensor that detects the moving position of the engagement portion that changes with the movement of the latch mechanism along the axis caused by the latch mechanism drive means.

In the above-described lid opening/closing system, it is preferred that the container body have a flange portion that extends from the periphery of the opening parallel to a surface on which the opening is formed and forms a receiving recess in which the lid is received in a state in which the opening is closed by the lid and an insertion hole that passes from an outer surface of the flange portion to the receiving recess and is provided at a position aligned with the engaged portion in a state in which the lid is received in the receiving recess, the latch mechanism can move along an axis parallel to the surface on which the opening is formed, the engagement portion reach the receiving recess through the insertion hole, the engagement portion can engage with the engaged portion of the lid disposed in the receiving recess, and engagement of the engagement portion and the engaged portion and release of the engagement be achieved by the movement of the latch main body along the axis.

In this case, it is preferred that the engaged portion have an L-shape including a first straight portion that extends along a direction in which the outer peripheral surface of the flat plate-like shape of the lid extends and is closed at one end thereof to form a closed end, and a second straight portion that has an open end on one side of the flat plate-like shape, joins to the other end of the first straight portion, and extends along a thickness direction of the lid, and one end of a movable range over which the engagement portion is moved by the latch mechanism drive means correspond to the open end of the second straight portion, and the other end correspond to a position more distant from the second straight portion than the closed end of the first straight portion. It is also preferred that the engagement portion position detection sensor can generate a first signal indicating that the engagement portion is located at the closed end or in a range from the closed end to a position at a specific distance from the closed end toward the second straight portion, a second signal indicating that the engagement portion is located in a range from the closed end to the other end of the range of movement of the engagement portion, and a third signal indicating that the engagement portion is located in the other range.

It is also preferred that the above-described lid opening/closing system further comprise a door position detection sensor that detects the position of the door to thereby detect the distance between the lid held by the door and the container body, which changes depending on the position of the door. In this case, it is preferred that the door position detection sensor be composed of a photo sensor disposed in the vicinity of the opening portion in the mini-environment and a sensor dog disposed at a position corresponding to the photo sensor on the outer circumference of the door. It is more preferred that the door position detection sensor can generate a first door position signal indicating that the lid and the opening of the container body are in a specific positional relationship and a second door position signal indicating that the lid is in close contact with the container body to close the opening of the container body.

Change of the diameter of wafers used in semiconductor manufacturing process from 300 mm (the diameter of currently used wafers) to 450 mm have been considered. In pods that store such large-diameter wafers, it is required, with an increase in the size of the lid, to prevent deformation such as warpage and bending of the lid and to fix the lid reliably with adequate strength in fixation. The lid of the pod according to the present invention has a simple flat plate-like structure, and therefore the lid can easily be made light in weight, and the structure that adds rigidity of the lid while achieving a decrease in the weight can be used. Thus, such requirements can easily be met with reliability. The present invention provides a lid opening/closing system suitable for use with pods having the above-described structure, and enables to achieve a reliable fixation of the lid to the pod body when the pod is closed by the lid, which has been difficult with conventional pods.

Furthermore, since a lid having a simple plate-like shape can be used with the system according to the present invention, the lid can be advantageously reinforced against deformation in various ways. In addition, when the lid is fixedly attached to the pod body, the state of the engagement of them can be detected reliably.

According to the present invention, in the state in which the lid is fixed on the pod body, the lid is always biased in the direction of closing the pod opening. Furthermore, when fixing the lid, the latch mechanism that fixes the lid on the pod can apply a gradually increasing biasing force to the lid in the direction pressing the lid toward the pod opening. This enables an improvement in the air-tightness of the pod itself and a reduction in the possibility of generation of dust due to vibration of the lid during transportation. In addition, it is possible to fix the lid on the pod or bring the lid into close contact with the pod in a preferred manner without increasing the driving force of the door. Thus, the closing force of the door can be controlled in several stages without high speed operation of the latch mechanism and without application of load in a short time. Therefore, stable engagement between the pod and the lid can be achieved without the generation of a large load acting temporarily between the pod body and the lid during the operation of the latch mechanism, unlike with conventional systems in which the latch mechanism starts to function abruptly at a certain operation position during the operation of the latch mechanism.

In the present invention, in the drive mechanism for operating the latch mechanism, the size of an operation portion (i.e. drive contact surface that will be described later) for operating the latch mechanism may be arbitrarily designed. Therefore, the degree of accuracy in the position at which the pod is kept when the lid is opened by the door may be lower than in the case of conventional systems. In the case of conventional systems, detachment of the lid from the pod and establishment of communication between the interior space of the pod and the mini-environment cannot be performed unless a high degree of accuracy is achieved in all of the fixed position of the lid relative to the placement position, the fixed position of the pod relative to the opening portion and the position of contact of the door to the lid determined by the latch mechanism. According to the present invention, at least requirement for accuracy of the fixed position of the lid and pod determined by the latch mechanism is relaxed, which advantageously leads, for example, to a simplification of the operation program of the lid opening and closing apparatus and stability of operation. Therefore, the operation state of the latch mechanism can be detected easily with reliability, and the state of fitting of the lid into the pod body that can be affected by the operation state of the latch mechanism can also be detected with reliability.

BRIEF DESCRIPTION OF THE DRAWINGS

FIG. 1A is a perspective view showing the general structure of the relevant portion of a pod according to an embodiment of the present invention and a lid opening and closing system corresponding thereto.

FIG. 1B is an enlarged view showing a portion 1B in FIG. 1A.

DESCRIPTION OF THE EMBODIMENTS

Figure 2:
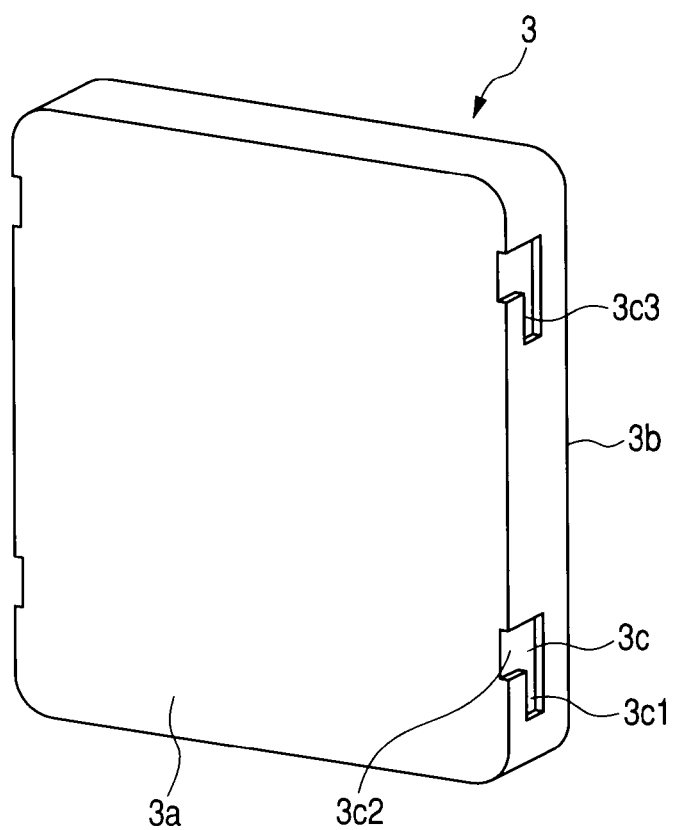
FIG. 2 is a perspective view showing the structure of the lid of the pod shown in FIG. 1A.
Figure 3:
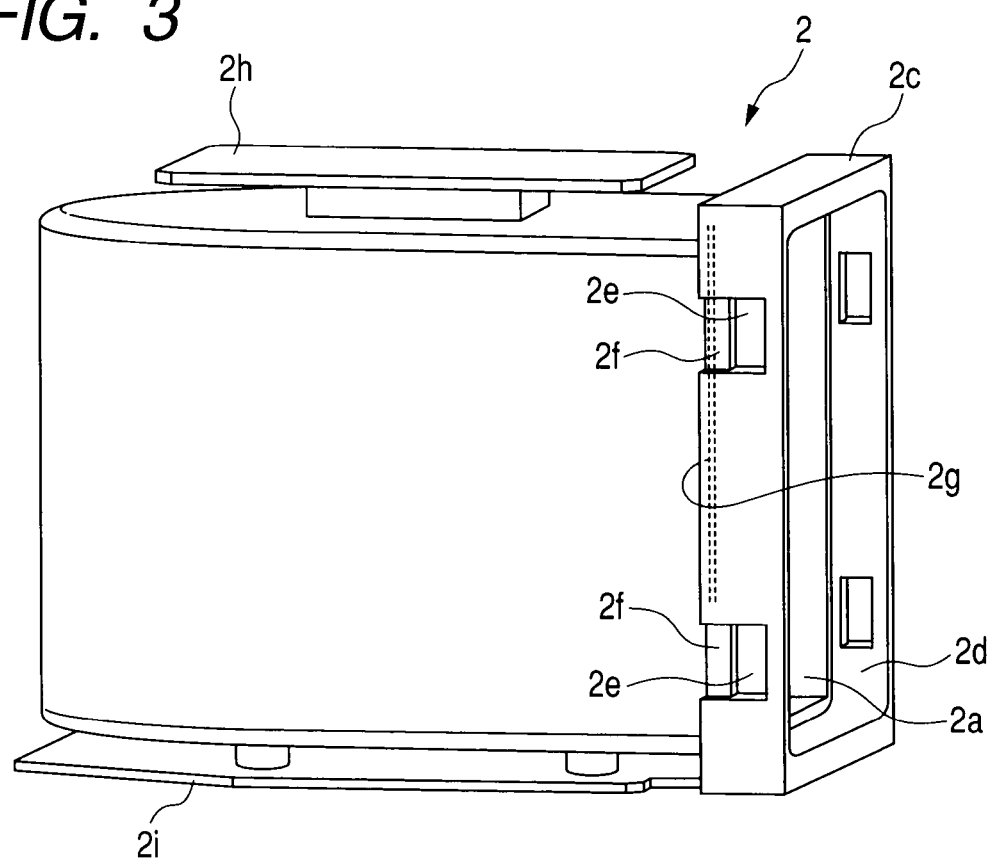
FIG. 3 is a perspective view showing the structure of the pod body of the pod shown in FIG. 1A.
Figure 4:
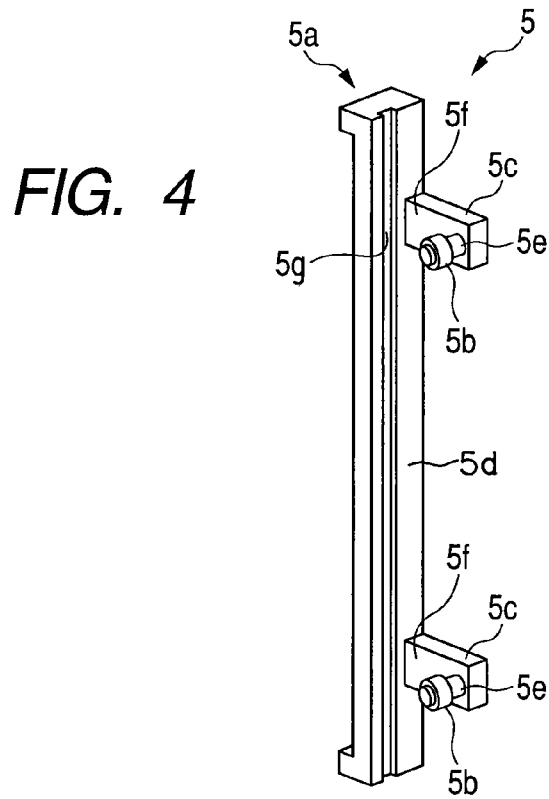
FIG. 4 is a perspective view showing the structure of the latch mechanism of the pod shown in FIG. 1A.
Figure 5A:
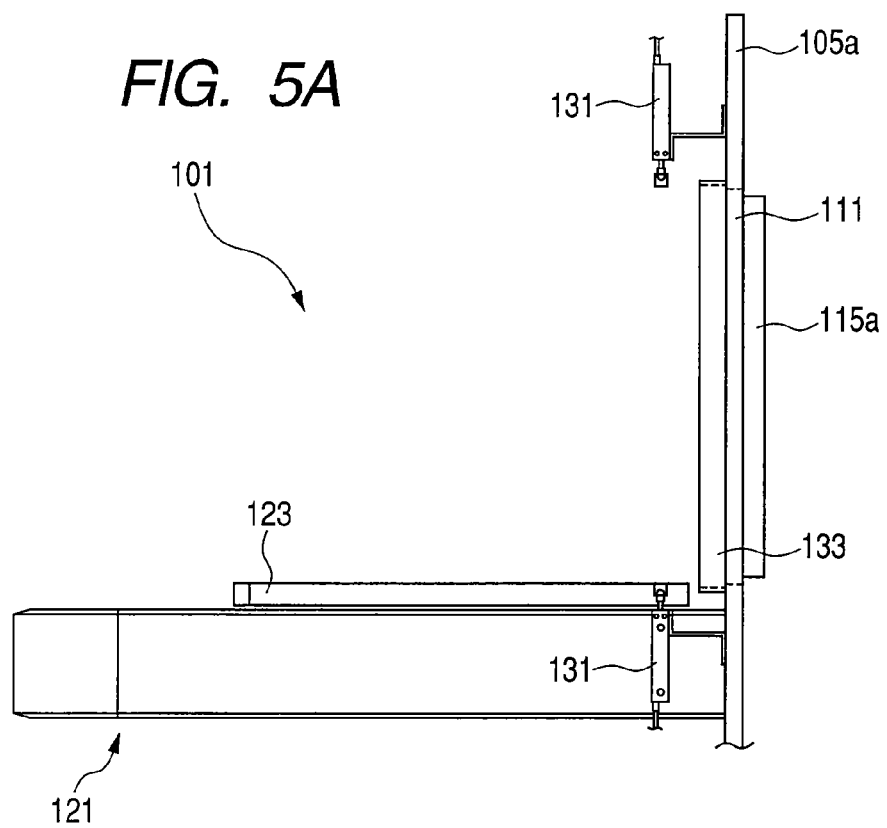
FIG. 5A is schematic diagram showing the relevant portion of the lid opening and closing system shown in FIG. 1A.
Figure 5B:
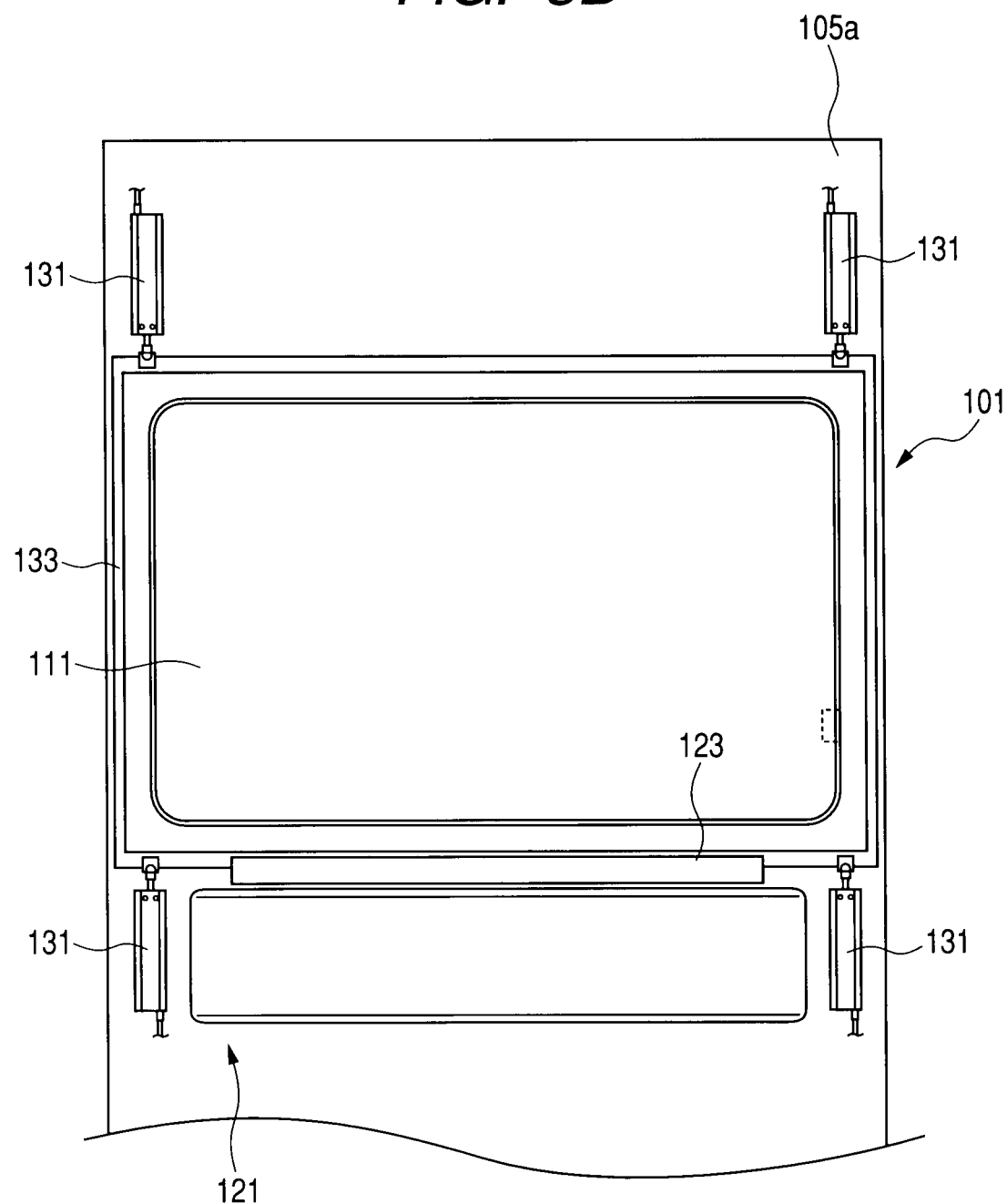
FIG. 5B is a schematic diagram showing the portion shown in FIG. 5A as seen from the external space or the front side.
Figure 6A:
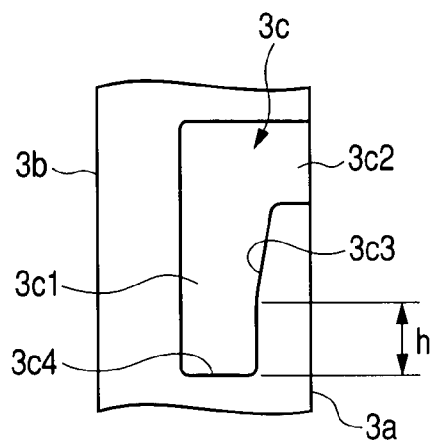
FIG. 6A shows the shape of an engaged recess 3c according to an embodiment of the present invention as seen from its front.
Figure 6B:
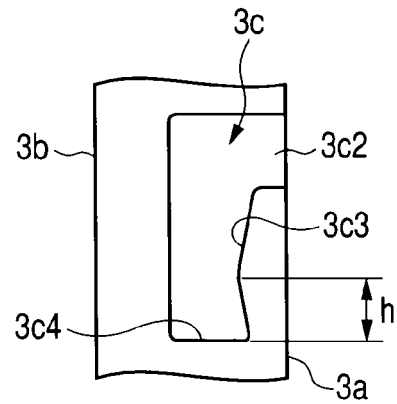
FIG. 6B shows the shape of an engaged recess 3c according to another embodiment of the present invention as seen from its front.
Figure 7A:
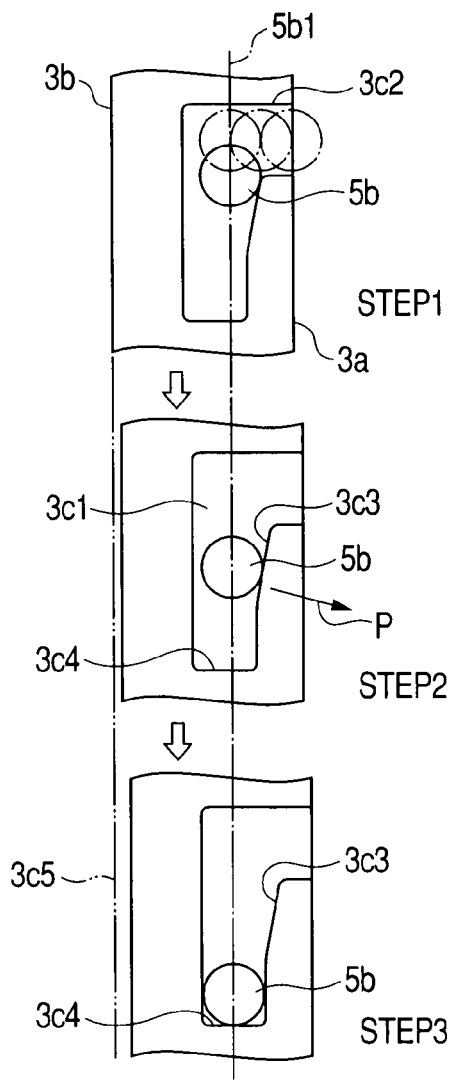
FIG. 7A shows some stages of the operation of a latch mechanism in relation to the engaged recess 3c shown in FIG. 6A.
Figure 7B:
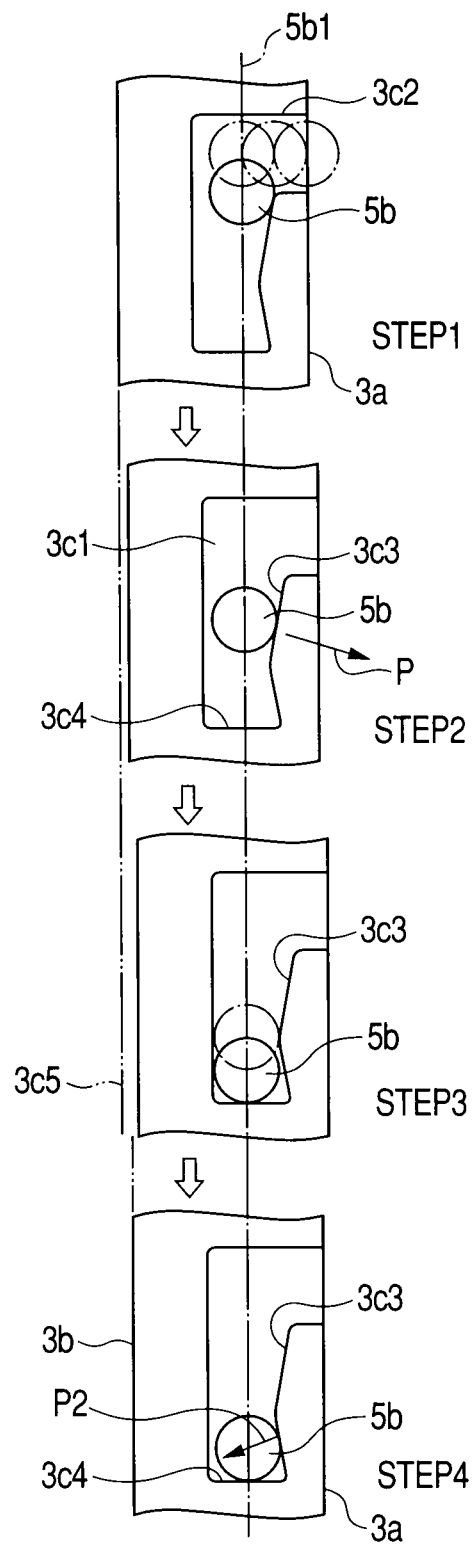
FIG. 7B shows some stages of the operation of a latch mechanism in relation to the engaged recess 3c shown in FIG. 6B.

In the following, an embodiment of the present invention will be described with reference to the drawings. FIG. 1A is a perspective view of a pod as an embodiment of the closed container according to the present invention and a FIMS in the form of a lid opening/closing system in a state in which the pod is placed at a position at which the lid is to be closed or opened. FIG. 1B is an enlarged view of region 1B in FIG. 1A showing the engagement of a roller portion of a latch mechanism, which will be described later, in the state as shown in FIG. 1A. FIG. 2 is a schematic perspective view of the lid of the pod. FIG. 3 is a schematic perspective view of the body of the pod. FIG. 4 is a schematic perspective view of the latch mechanism fixed on the pod body. FIG. 5A is a side view of a support table and a wall in which an opening portion of a mini-environment is provided. FIG. 5B is a front view of them as seen from the side on which the pod is disposed. FIGS. 6A and 6B show the shapes of engaged recesses that will be described later as seen from their front. FIGS. 7A and 7B schematically show the operation of the latch mechanism and the lid when the lid having the engaged recess is fixedly attached on the pod body.

The pod 1 or a closed container is composed of a pod body 2 as a main body of the container, a lid 3 and a latch mechanism 5 attached to the pod body 2 in a slidable manner. The pod body 2 is of a substantially cubical shape and has an interior space in which a plurality of contents such as wafers are stored one above another along the vertical direction. The pod body may have various shapes in which wafers can be stored. However, the basic shape of the pod is a cubical shape, and in this sense we describe it as a substantially cubical shape in this specification. The pod body 2 has an opening 2a allowing communication with the storage space on one side face of the substantially cubical shape. The opening 2a allows communication between the above described interior space and the exterior space. On the aforementioned lateral side is also provided a flange portion 2c that extends outwardly from the periphery of the opening 2a in a plane parallel to an opening plane that contains the opening 2a in such a way as to surround the periphery of the opening 2a. The flange portion 2c has a lateral end surface that is parallel to the aforementioned side face. The lateral end surface is to be opposed to a wall having an opening of a load port serving as a lid opening/closing system that will be described later. The flange portion 2c has a thickness larger than the thickness of the lid 3. The flange portion 2c has a receiving recess 2d into which the lid 3 is to be fitted when the opening 2a is closed by a flat surface (rear surface 3a that will be described later) of the lid 3 having a flat plate-like shape. Thus, the lid 3 is received in the receiving recess 2d when the opening 2a is closed by it.

On the outer peripheral surface of the flange portion 2c, namely on the outer side surfaces thereof in this embodiment, are provided roller portion insertion holes 2e having rectangular shapes as insertion holes that pass from the exterior space to the receiving recess 2d. The roller portion insertion holes 2e are provided at two positions or upper and lower positions on each of the outer side surfaces of the flange portion 2c. In this embodiment, slide rails 2g on which the latch mechanism 5 is to be supported are also provided on the flange portion 2c. The slide rail 2g is disposed on the rear surface of the flange portion 2c (the surface on the pod body side) or the surface that is opposite to the aforementioned lateral end surface in such a way as to be adjacent to the outer side surface and extend in the direction in which the outer side surface extends. Furthermore, the pod body 2 has a hold flange 2h to be held by a pod transfer robot (not shown) provided on the top thereof and a fixation flange 2i provided on the bottom thereof and to be in actual contact with the support table and to be fixed thereon. The fixation flange 2i is provided with an engaged portion etc. (not shown). The hold flange 2h and the fixation flange 2i have nothing to do with the characterizing features of the pod according to the present invention, and they will not be described in further detail.

The lid 3 is a flat plate-like member having a rear surface 3a to face the interior space when the opening 2a of the pod body 2 is closed by the lid 3 and a front surface 3b to face the exterior space. On a outer peripheral surface of the flat plate-shaped lid 3, namely on the outer side surface in this embodiment, are provided a pair of engaged recesses 3c at upper and lower positions corresponding to the positions of the above described roller portion insertion holes 2e on the pod body 2. The engaged recess 3c, which serves as engaged portion, has an L-shape including a first straight portion 3c1 that extends in the direction in which the outer side surface of the lid 3 on which the engaged recess 3c is provided extends and a second straight portion 3c2 that is in communication with the first straight portion and extends in a direction perpendicular to the direction in which the first straight portion extends. One end of the second straight portion 3c2 opens at the rear surface 3a of the lid 3. That is, the first straight portion 3c1 has a closed end 3c4 at one end and joins to the second straight portion 3c2 at the other end. The length and the width of the first straight portion are equal respectively to the length and the width of the above described roller portion insertion holes 2e provided on the pod body 2. In the first straight portion 3c1, the inner wall 3c3 located closer to the rear surface 3a of the lid 3 to constitute a part of the engagement recess serves as an engagement surface that engages with a roller portion 5b that will be described later. The front surface 3b of the lid 3 has suction areas to be held by suction by suction pads provided on the door that will be described later. The surface of the suction area has been processed by surface polishing to enable effective suction holding. On the front surface 3b of the lid 3, there are dust particles or the like that adhered to it when the pod was being transferred in a space in which the degree of cleanness is low. In view of this, in order to provide a seal by the suction pads to prevent diffusion of the dust into the mini-environment, it is preferred that the suction areas be provided to cover nearly the entire area of the front surface 3a.

The structure of the engaged recess 3c will be described in detail with reference to FIG. 6A. The first straight portion 3c1 does not have a constant width along the direction in which the flat plate-like shape extends, but the width of the first straight portion 3c1 changes. Specifically, the width of the first straight portion 3c1 increases on the side close to the rear surface 3a of the rid in the region joining to the second straight portion 3c2, namely the width decreases toward the closed end 3c4 of the first straight portion 3c1 but is constant in the region within a certain distance h from the closed end. Thus, the inner wall 3c3 forms a slanted surface that is closest to the rear surface 3a of the lid at the portion opening (or joining) to the second straight portion 3c2 and runs away from the rear surface 3a of the lid as it approaches the closed end 3c4, and the inner wall 3c3 becomes parallel to the rear surface 3a of the lid from the position at the certain distance h to the closed end 3c4. Advantages of the above-described shape of the engaged recess 3c will be described with reference to FIG. 7A. FIG. 7A shows changes in the positional relationship between the engaged recess 3c and a roller portion 5b that will be described later in the process of fixing the lid 3 on the pod body 2. The center line 5b1 drawn as an alternate long and short dashed line in FIG. 7A indicates the axis of movement of the roller portion 5b and the chain double dashed line is the line indicating the position of the front surface 3b of the lid 3 at the time when the lid 3 is brought into contact with the pod body 2 by the door that will be described later and its extension 3c5. The positional relationship between the lid 3 and the roller portion 5*b* changes in order of steps from above to below in FIG. 7A. In Step 1, upon the operation of attaching the lid 3 onto the pod body 2, the roller portion 5*b* enters the second straight portion 3*c*2, and then the roller portion 5*b* moves to the first straight portion 3*c*1 as the lid 3 is pushed in to a predetermined position. When the front surface 3*b* of the lid 3 reaches the predetermined position 3*c*5, the movement of the lid 3 by the door (not shown) is stopped. At this time, a latch mechanism that will be described later starts to operate, whereby the roller portion 5*b* starts to move toward the closed end 3*c*4 of the lid 3 along the axis of movement. While the roller portion 5*b* moves along the axis, it is in contact with the slanted surface of the inner wall 3*c*3 and exerts a pressing force P on the slanted surface in the direction in which the lid 3 is pressed against the pod body 2. The lid 3 is pushed toward the pod body 2 by this pressing force P to move toward the rear surface 3*a* side beyond the extension line 3*c*5 as shown in Step 2. As the roller portion 5*b* further moves and reaches the constant width region of the first straight portion 3*c*1, the pushing of the lid 3 ends, and a state in which the lid 3 is closely attached on the pod body 2 with a certain load is achieved as shown in Step 3.

Next, another configuration of the engaged portion 3*c* will be described with reference to FIGS. 6B and 7B. Descriptions of the portions, structures, and steps in FIGS. 6B and 7B that are the same or similar to those in FIGS. 6A and 7A will be omitted, and only the differences will be described. In the configuration shown in FIGS. 6B and 7B, the orientation of inclination of the inner wall 3*c*3 changes at a position at a certain distance h from the closed end 3*c*4 (i.e. at a position at a certain distance from the joining portion of the first straight portion 3*c*1 and the second straight portion 3*c*2), and the inner wall 3*c*3 approaches the rear surface 3*a* again. In this configuration, the motions of the lid 3 and other components as the roller portion 5*b* actually moves toward the closed end 3*c*4 will be described with reference to FIG. 7B. Motion of the roller portion 5*b* and the lid 3 relative to each other in Steps 1 to 3 is the same as that described in connection with FIG. 7A. However, in the configuration shown in FIGS. 6B and 7B, the pressing force P that the roller portion 5*b* exerts on the inner wall 3*c*3 is relaxed as the roller portion 5*b* approaches the closed end 3*c*4 beyond the position at the aforementioned distance h from the closed end 3*c*4, whereby the lid 3 moves back a little toward its initial position from its position closest to the pod body 2. Specifically, as shown in Step 4, the lid 3 shifts from its position shown in Step 3 toward the front surface 3*b* side. Thus, a state in which the inner wall 3*c*3 having a reverse inclination exerts a restoring force P2 on the roller portion 5*b* is achieved eventually. In this state, the roller portion 5*b* is pressed against the closed end 3*c*3 by the restoring force P2, and consequently the roller portion 5*b* is always kept on the closed end 3*c*4 even if an external force acts on the pod or other components.

Next, the latch mechanism 5 will be described in detail. The latch mechanism 5 has a latch main body 5*a*, roller portions 5*b* serving as engagement portions and link portions 5*c* linking the latch main body 5*a* and the roller portions 5*b*. The latch main body 5*a* is a rectangular column-like member extending in one direction. The latch main body 5*a* is opposed to the rear surface and the side surface of the flange portion 2*c* of the pod body 2 by a first opposed surface 5*d* of the latch main body 5*a* and a second opposed surface 5*f* of the link portion 5*c*. On the first opposed surface 5*d* is provided a guide groove 5*g* for receiving the aforementioned slide rail 2*g* in a slidable manner. The guide groove 5*g* extends along the longitudinal direction of the latch main body 5*a* on the first opposed surface 5*d*. That is, the latch main body is attached to the pod body 2 slidably along one axis corresponding to the longitudinal direction. Further, the movement of the latch main body along the one axis is recognized as a movement of the latch mechanism 5. The link portions 5*c* project from the surface on which the first opposed surface 5*d* is provided in the direction perpendicular to the longitudinal direction of the latch main body 5*a*. There is a pair of such link portions 5*c* disposed at upper and lower positions corresponding to the aforementioned roller portion insertion holes 2*e*. In this embodiment, the first opposed surface 5*d* and the second opposed surface 5*f* are configured to be opposed to the flange 2*c* with a small gap being left between them and the flange 2*c* so that any contact or friction will not occur. These components can be arranged in various ways. For example, the direction in which the link portion 5*c* extends from the latch main body 5*a* may be oriented in any direction on condition that the link portion 5*c* can support the roller portion 5*b* serving as the engagement portion.

The roller portions 5*b* protrude into the lid receiving recess 2*d* through the roller portion insertion holes 2*e* provided on the flange portion 2*c* and abut to portions of the inner walls 3*c*3 of the aforementioned engaged recesses 3*c*. The roller portion 5*b* has a disk-like shape and is rotatably supported on the link portion 5*c* by a rotary shaft 5*e* that is perpendicular to the bottom surface. The rotary shaft 5*e* extends in a direction perpendicular to both the longitudinal direction of the latch main body 5*a* and the direction in which the link portion 5*c* projects. By this configuration, the roller portion 5*b* is translated in a plane perpendicular to the rotary shaft 5*e*. In other words, when the latch main body 5*a* slides in the longitudinal direction, the roller portion 5*b* rolls about the rotary shaft 5*e* with its outer circumference (or the outer circumference of the circular disk) being kept in contact with the inner wall while changing the position of contact with the inner wall. In this embodiment, an elastic material such as rubber is attached on the outer circumference of the disk of the roller portion 5*b* so that the disk has elasticity in the circumferential direction. Thus, when the roller portion 5*b* moves by rotation, the contact portion is prevented from sliding without rotation, whereby generation of dust can be prevented.

In the following, how the lid 3 is detached from the pod body 2 by the latch mechanism 5 will be described. As shown in FIG. 1A, in the state in which the lid 3 is received in the receiving recess 2*d* of the pod body 2 to close the opening 2*a*, each roller portion 5*b* is located at the lower position in the corresponding roller insertion hole 2*e*, i.e. at the closed end 3*c*4 of the first straight portion 3*c*1 of the L-shaped engaged recess 3*c*. The latch mechanism 5 may be positioned at the closed end by the effect of its own weight. In this embodiment, the roller 5*b* is elastic, and the roller portion 5*b* is designed to bias the lid 3 at this position in such a direction as to bring the lid 3 into close contact with the pod body 2, and the roller portion 5*b* is retained stationary at the aforementioned position by a reaction force of the biasing force. As the latch mechanism 5 is caused to slide from the above described position upwardly in FIG. 1A to a latch release position, each roller portion 5*b* moves to a position at which the first straight portion 3*c*1 and the second straight portion 3*c*2 of the L-shaped engaged recess 3*c* meet. With this movement, the roller portion 5*b* is positioned in the second straight portion 3*c*2 that opens on the rear surface 3*a* of the lid, where there is no inner wall 3*c*3 to which the roller portion 5*b* abuts. Therefore, restraint on the lid 3 by the roller portion 5*b* no longer exists, and the lid 3 is movable in the longitudinal direction of the second straight portion 3*c*2, i.e. in the direction in which the lid 3 is moved away from the pod opening 2*a*.

In the above described pod 1, the lid 3 is a flat plate member that is provided with only engaged recesses 3c on its outer peripheral surface. Therefore, even if it is left in a space in which dust or the like is not controlled, the possibility of adhesion of dust or the like and the possibility of deposition of dust in the interior of the lid is relatively low, because it has no holes for receiving latch keys that are provided in conventional lids. Furthermore, since most part of dust, if any, adhering on the lid will be on the flat front surface thereof, it can be easily removed by cleaning or by presence of downward air flow. In addition, since there is no need to provide conventional operation members for latch keys on the surface of the door, the structure of door can be made simple, and the degree of cleanness of the environment can be enhanced with this simplification. Furthermore, when fixing the lid 3 to the pod body 2, the latch mechanism 5 can push the lid into the pod body 2 with a gradually increasing load. Therefore, a satisfactory contact between the lid and the pod body can be achieved even in cases where a lid 3 having a larger size is used.

In the following, a lid opening and closing system for a closed container according to the first embodiment of the present invention suitable for use with the above described pod will be described. FIG. 1A shows the above described pod 1, a pod support portion 121 of the lid opening and closing mechanism 101 that will be described later, a docking plate 123, a door 115a, a first opening portion 111, a cabinet wall 105a, latch mechanism drive units 131 and a flange cover 133. Characteristic features of this lid opening and closing system 101 include the latch mechanism drive units 131 serving as means for driving the latch mechanism and the flange cover 133. In this embodiment, the latch mechanism drive unit 131 includes an actuator having a rod that can extend and retract along one axis. The latch mechanism drive unit 131 is disposed in such a way that when the lid 3 of the pod 1 is at the position at which it is held by suction by the door 115a, the axes of the latch main bodies 5a of the latch mechanisms 5 and the axes of the rods of the corresponding actuators are aligned, and the rods are opposed to each other above and below the latch main bodies 5a. The latch mechanism drive unit 131 also functions as what is called a cylinder sensor, and generates a signal indicative of the operation state of the latch mechanism drive unit 131. Thus, the position of the latch main body 5a and the roller portion (or engagement portion) 5b in the latch mechanism 5 with respect to the axial direction of movement thereof can be detected. In pods to which the present invention is mainly applied, the position of the latch main body 5a uniquely indicates the state of engagement of the latch mechanism 5 to the lid 3, and therefore, the signal generated by the cylinder sensor can be used as a signal indicative of the latching status.

The latch mechanism drive unit 131 is composed of the rod that is disposed coaxially with the axis of movement of the corresponding latch main body 5a and capable of pushing the latch mechanism 5 along the axis of movement and an actuator that supports the rod in such a way that the rod can extend and retract along the axis of movement. Thus, the latch mechanism drive unit 131 in this embodiment is disposed at a position aligned with the corresponding latch mechanism 5 of the pod 1 placed at the position at which the lid 3 is detached so that it can push to drive the latch mechanism 5 in the vertical direction. It is preferred that the center axis of the rod be aligned with the axis of movement of the latch mechanism 5. The upper and lower end faces of the latch main body 5a of the latch mechanism 5 serve as surface to be pressed or the aforementioned contact drive surfaces. Thus, the end of the rod presses this surface to be pressed to drive the latch mechanism 5 along the axial direction.

The latch mechanism drive units 131 are driven by a control apparatus that will be described later so that the surface to be pressed or the upper and lower end faces of the latch main body 5a are held by the upper and lower units. It is preferred that the upper and lower latch mechanism drive units 131 each have an actuator composed of an air cylinder. By applying different pressures by the air cylinders in the upper and the lower units, the latch main body 5a can be moved at a speed or a biasing force corresponding to the pressure difference between them, after the latch main body 5a has been held between the rods of the upper and lower units. In the mode shown in FIG. 6A or 6B, if, for example, the latch main body 5a is driven by one latch mechanism drive unit 131, a load is applied on the lid 3 locally in a short time. On the other hand, if the latch main body 5a is moved using a pair of latch mechanism drive units 131 with a control on the speed and/or other factors, the fixation of the lid 3 can be performed with a moderate load over a significantly long time. Therefore, the pod 1 can be closed in a stable manner.

Figure 8A:
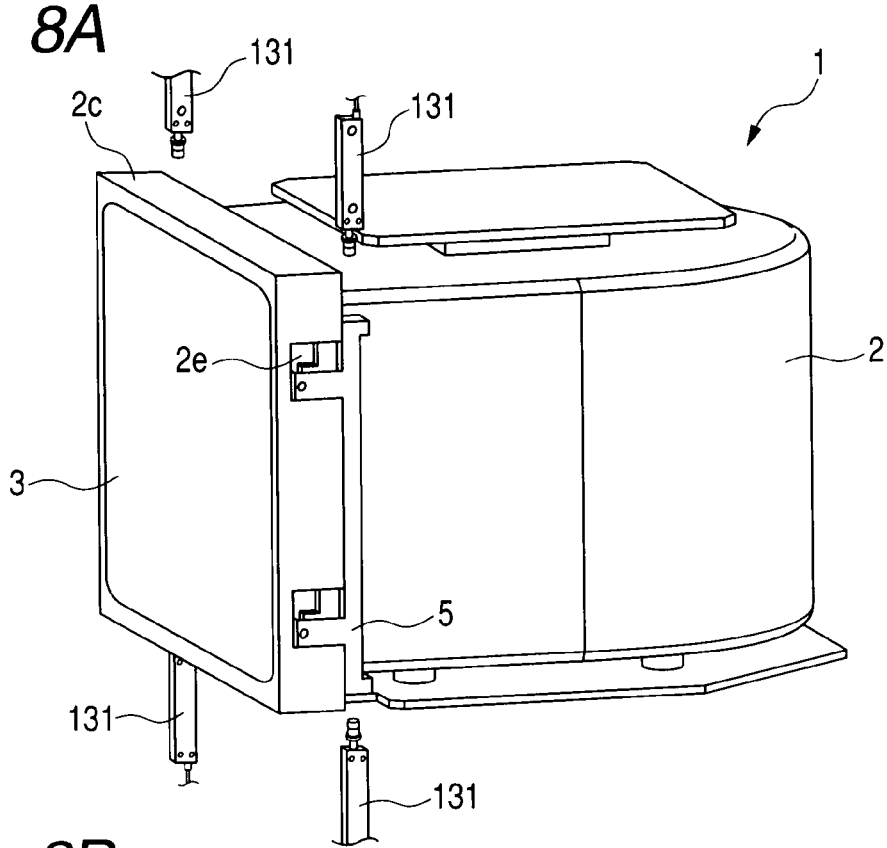
FIG. 8A is a diagram for illustrating a mode of operation of a latch mechanism drive unit and the pod shown in FIG. 1A.
Figure 8B:
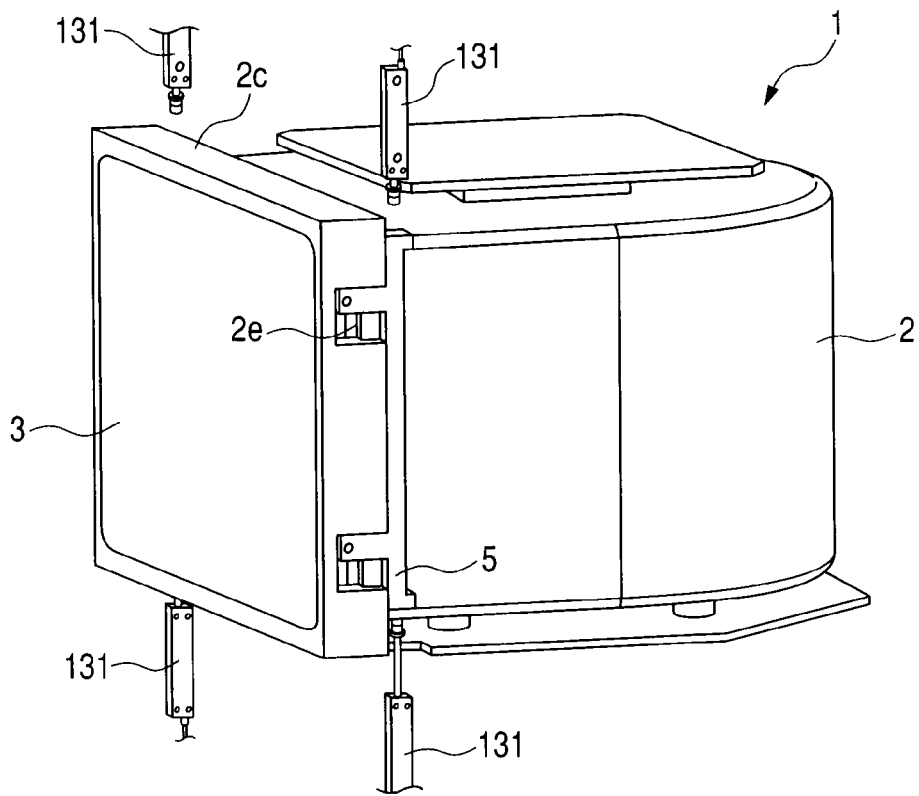
FIG. 8B is a diagram for illustrating a mode of operation of the latch mechanism drive unit and the pod shown in FIG. 1A.
Figure 8C:
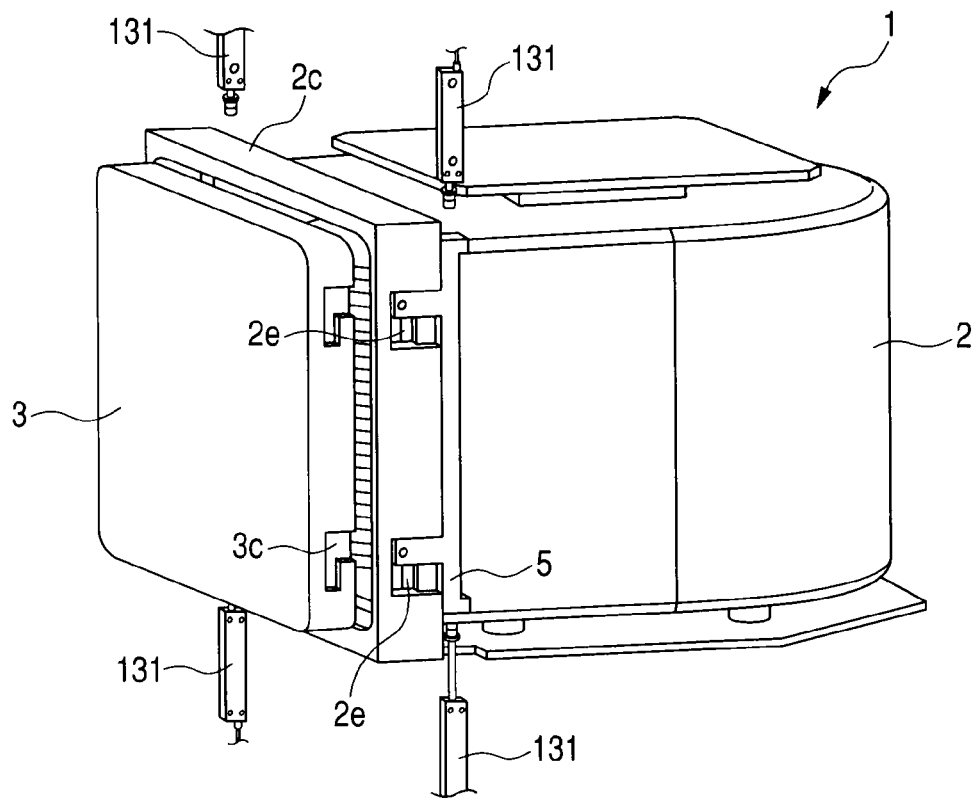
FIG. 8C is a diagram for illustrating a mode of operation of the latch mechanism drive unit and the pod shown in FIG. 1A.

Here, the operation sequence of the latch mechanism drive unit 131 upon actually opening and closing the lid 3 will be described with reference to FIGS. 8A to 8D. FIGS. 8A to 8D are perspective views showing only the pod 1 and the latch mechanism drive unit 131. FIG. 8A shows a state in which the pod 1 is placed at a position at which the lid 3 thereof is opened and closed by the door 115a. In this state, the surfaces to be pressed of the latch mechanisms 5 are spaced apart from the rod ends of the corresponding latch mechanism drive units 131 at a predetermined distance in the axial direction. The latch mechanism drive units 131 disposed below start to operate from this state and extend their rods to press the lower end surfaces of the latch main bodies 5a to move the latch mechanisms 5 upwardly as shown in FIG. 8B. By this operation, each roller portion 5b is positioned in the second straight portion 3c2 in the engaged recess 3c. In this position, engagement of the roller portion 5b and the engaged recess 3c has been released, and the lid 3 can be detached from the pod body 2. As described before, the roller portion 5b has an elastic material provided on the outer circumference of its disk, and the roller portion 5b is always in contact with the inner wall of the engaged recess 3c with a biasing force generated by its elasticity.

Figure 8D:
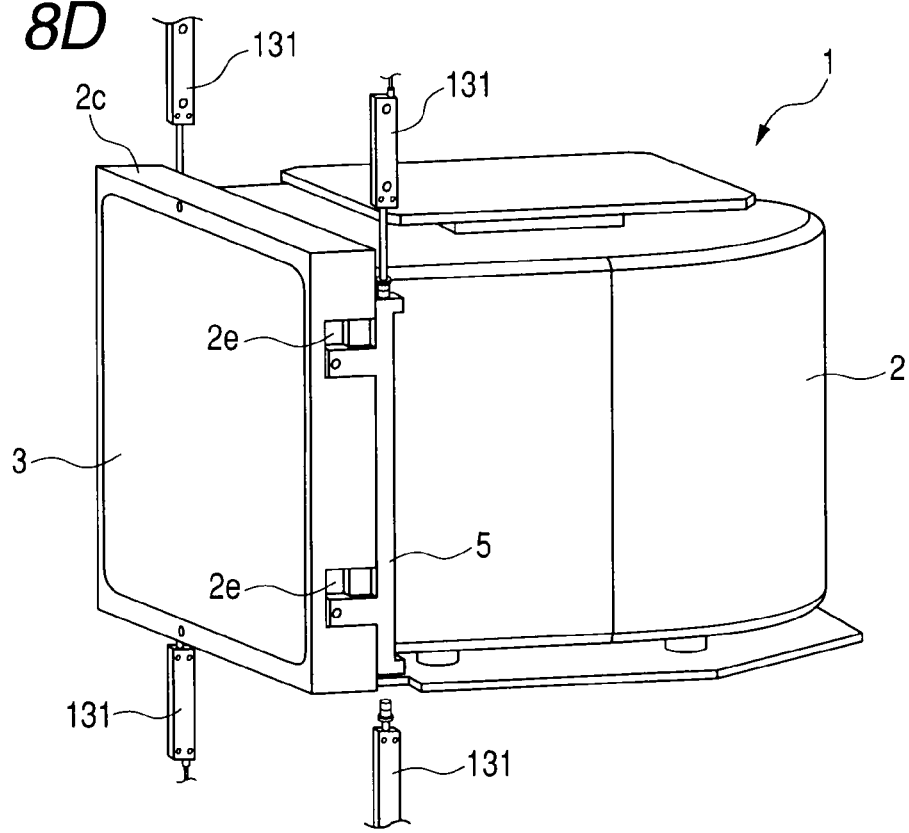
FIG. 8D is a diagram for illustrating a mode of operation of the latch mechanism drive unit and the pod shown in FIG. 1A.

After the above described state is achieved, the lid 3 is held by suction by the door (not shown in FIG. 8C) and the lid 3 is detached from the pod body 2 as the door moves. Thereafter, wafers stored in the interior of the pod body 2 are taken out through the opening 2a of the pod body 2 thus opened, and wafers having been processed by the processing apparatus are brought into the interior of the pod body 2. After transfer of all the wafers has been completed, the lid 3 is moved by the door back to the position shown in FIG. 8C, and then operation for closing the opening 2a with the lid 3 is performed. Thereafter, as shown in FIG. 8D, the latch mechanism drive units 131 disposed below the pod 1 retract the rods, and the latch mechanism drive unit 131 disposed above the pod 1 start their operation to extend the rods, thereby pressing the upper end faces of the latch main bodies 5a, whereby the latch mechanisms 5 are moved downwardly. Thus, each roller portion 5b is located in the first straight portion 3c1 in the engaged recess 3c. In this position, engagement of the roller portion 5b and the inner wall 3c3 is established, and the lid 3 is fixed to the pod body 2. After the engagement is achieved, the latch mechanism drive units 131 disposed above the pod 1 retract the rods. Thus, the state of the system returns to that shown in FIG. 8A. By the above described operations of the latch mechanism drive units 131, the sequence from detaching to attaching of the lid 3 from/to the pod 1 is performed.

Every time the latch mechanism drive unit 131 operates, a signal indicative of the latching status is generated by the aforementioned cylinder sensor. Thus, it is possible to determine whether or not the latch mechanism 5 is operating properly in relation to the lid 3 fixed at a predetermined position with respect to the pod body 2a. In this embodiment, the cylinder sensor is used, because it can sense the amount of extension of the actuator rod effectively with a simple structure. However, the sensor is not limited to this, and other sensors that can detect the amount of operation of the latch main body 5a by, for example, sensing the amount of extension of the actuator rod may be used. For example, a what is called a dog may be provided on the rod, and the dog may be detected from the side e.g. optically.

The lid opening and closing system according to the embodiment of the present invention is further provided with a flange cover 133. The flange cover 133 is an annular structure having an inner peripheral surface that can be opposed to the entire outer peripheral surface of the flange portion 2c of the pod 2. The flange cover 133 is provided in such a way as to project perpendicularly from the cabinet wall 105a on the side on which the pod 1 is placed (i.e. on the exterior space side). In the state in which the pod 1 is placed at a position at which the lid 3 is opened and closed by the door 115a, the flange cover 133 covers the outer peripheral surface of the flange portion 2c of the pod body 2 to block passages that directly lead from the exterior space to the outer peripheral surface. In this embodiment, there are passages leading from the exterior space to the storage space 2d in the pod body 2 through the roller portion insertion holes 2e whether the latch mechanism 5 is at a position at which it engages the lid 3 or a position at which it does not engage the lid 3. The interior of the pod is typically kept at a positive pressure in relation to the exterior space that is in communication therewith thanks to the effect of clean air supplied to the mini-environment. Therefore, in conventional systems, outward air flow is present in the roller portion insertion holes 2e, and there are no problems in dust control. In this embodiment, the flange cover 133 is further provided, whereby passages leading from the storage space 2d to the exterior space formed substantially through the roller portion insertion holes 2e can be made as small as possible. By this feature, it is possible to prevent very small dust particles from entering the storage space 2d through the roller insertion holes 2e by, for example, expansion of the region of molecular motion.

Figure 9:
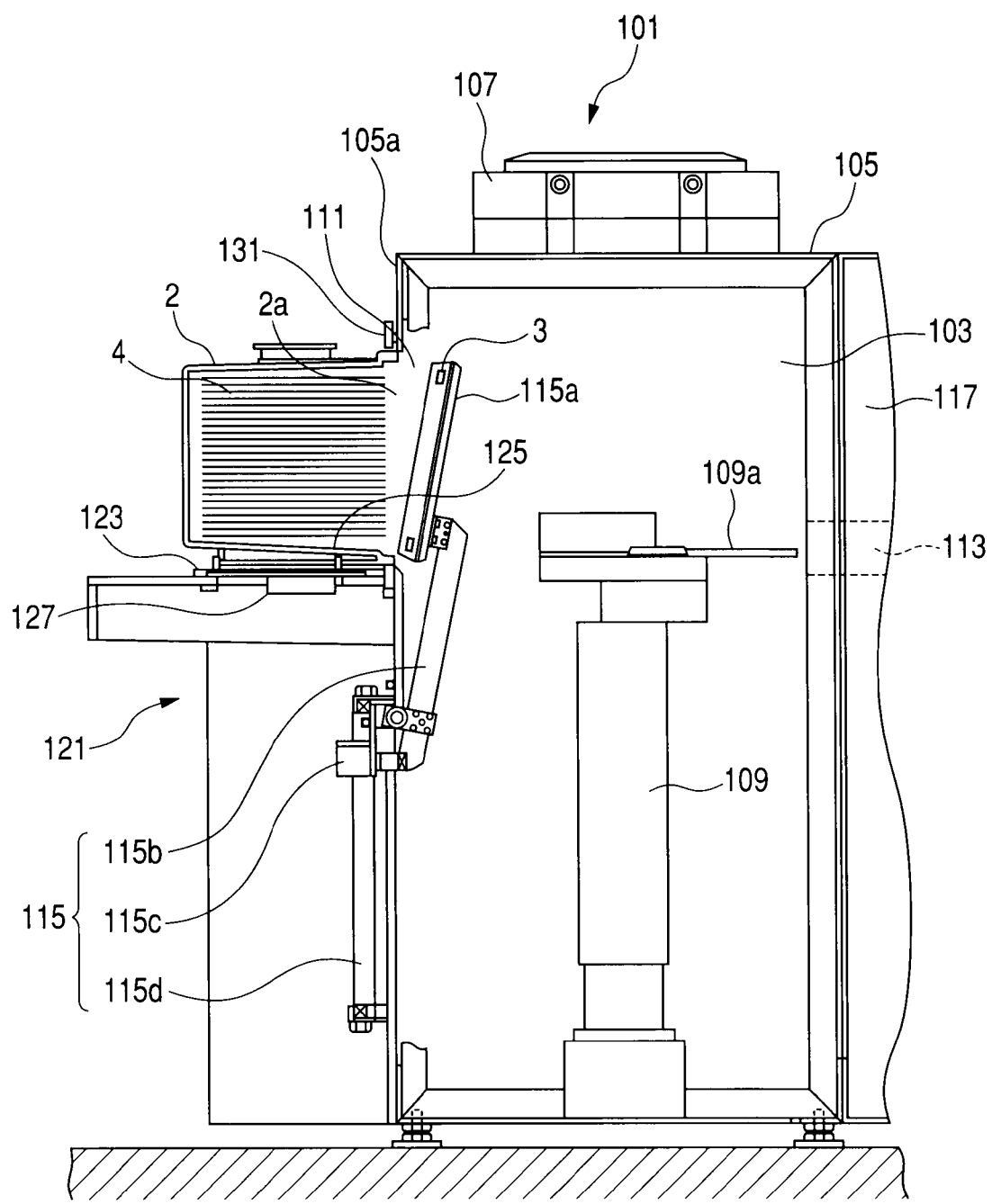
FIG. 9 is a side cross sectional view showing the general structure of a load port apparatus according to an embodiment of the present invention.
Figure 10:
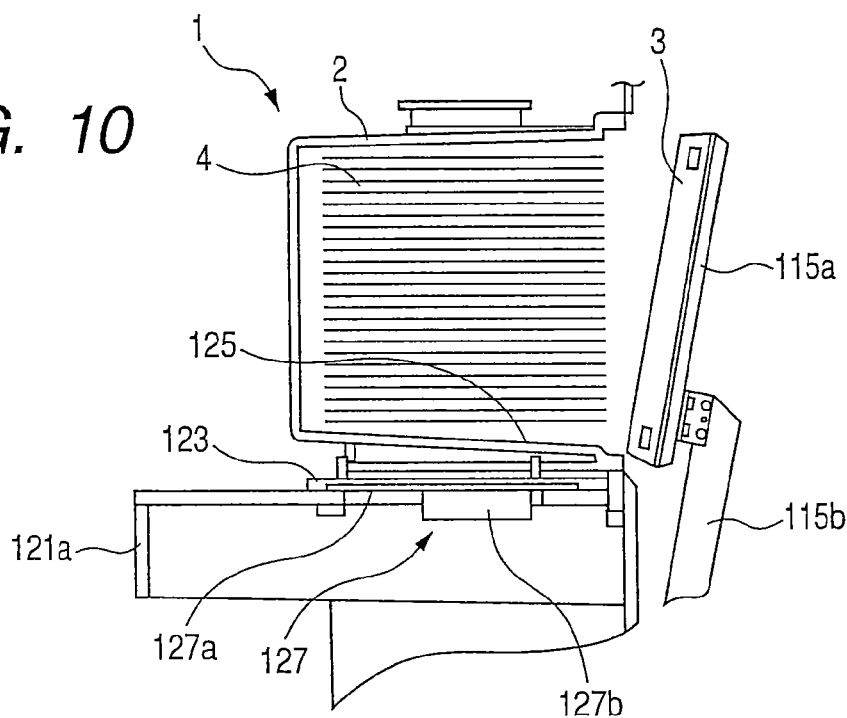
FIG. 10 is an enlarged side cross sectional view showing the general structure of the relevant portion of the load port apparatus according to an embodiment of the present invention in a manner similar to FIG. 9.
Figure 11:
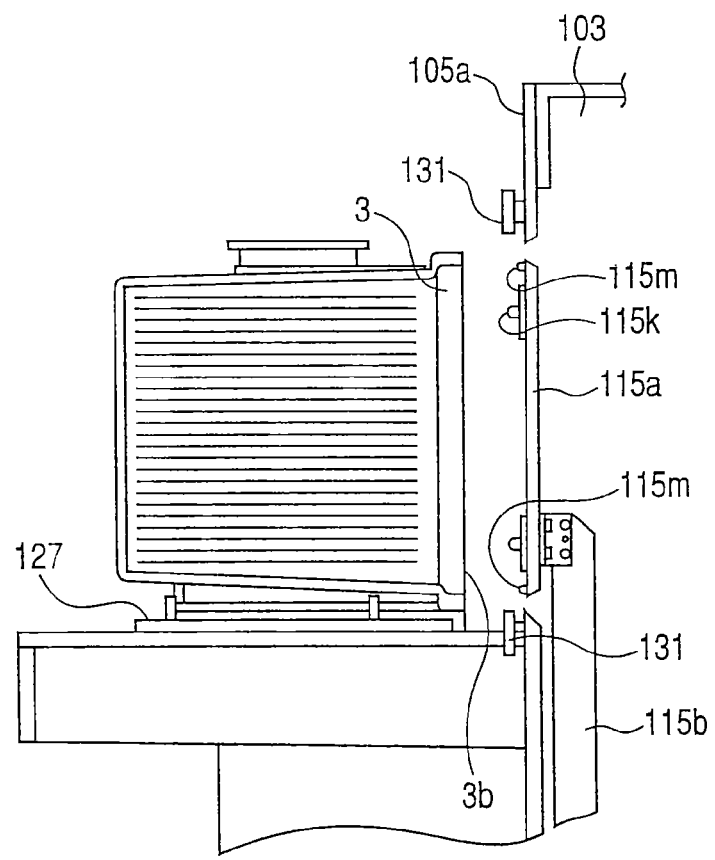
FIG. 11 shows the portion shown in FIG. 10 in the state in which the pod is located at the loading position.

In the following the lid opening/closing system according to this embodiment will be described. FIG. 9 is a cross sectional side view showing the general structure of the system. FIG. 10 is an enlarged view showing a pod support portion, a door, a pod and a lid etc. in the system 101 in a similar manner. FIG. 11 schematically shows the pod support portion and the door etc. in the state in which the opening of the pod is closed by the lid. The lid opening and closing system 101 has a cabinet 105 that defines a mini-environment 103 and a pod support portion 121 provided adjacent to the cabinet 105. The cabinet 105 is provided with a fan 107, a robot 109, a first opening 111, a second opening 113 and a door system 115. The fan 107 is provided on the cabinet 105 in the upper portion of the mini-environment 103 to introduce the air in the space outside the cabinet 105 into the mini-environment. The fan 107 is equipped with a filter suitable for the degree of cleanness in the exterior space to remove contaminant such as dust from the air introduced from the exterior space. The bottom portion of the cabinet 105 has a structure that allows the air to flow to the exterior. Thus, dust particles or the like generated in the mini-environment 103 are brought by the air flow and discharged to the exterior space from the bottom of the cabinet 105.

A robot arm 109a of the robot 109 can extend to the exterior of the mini-environment through the first opening 111 and the second opening 113. The first opening 111 is closed, in a way, by the door 115a of the door system 115, where a gap is left between the outer periphery of the door 115a and the inner peripheral surface of the first opening 111. Thus, it should be said that the door 115a can nearly close the first opening 111. The second opening 113 leads to the interior of a wafer processing apparatus 117. The details of the wager processing apparatus 117 will not be described in this specification, since they have no direct bearing on the present invention. The latch mechanism drive unit 131 and the flange cover 133 have been already described, and no further description will be made. In addition, to facilitate understanding, the flange cover 133 is not illustrated in FIGS. 7 to 9.

The pod support portion 121 has a docking plate 123, a pod fixing system 125 and a docking plate drive system 127. The upper surface of the docking plate 123 is substantially flat, and some portions of the pod fixing system 125 is provided thereon. The pod 1 according to the present invention is placed on the upper surface of the docking plate 123, and the aforementioned portions (specifically, in the form of pins) of the pod fixing system 125 come into engagement with engaged portions (not shown) provided on the bottom surface of the pod 1 to fix the pod 1 at a prescribed position on the docking plate 123. The docking plate 123 is configured in such a way that the opening 2a of the body of the pod 1 is just opposed to the above described first opening 111 when the pod 1 is placed on the upper surface of the docking plate 123. The docking plate drive system 127 drives the docking plate 123 and the pod 1 fixed at the prescribed position thereon toward/away from the first opening 111 using a guide rail 127a and a drive cylinder 127b.

One end of the drive cylinder 127b is fixed to the body 121a of the support table, and the other end or the end of an extendable/retractable cylinder is fixed to the docking plate 123. The docking plate 123 is supported on the guide rail 127a in a slidable manner so that it can slide on the guide rail 127a with extension/retraction of the cylinder end of the drive cylinder 127b. The docking plate 123 is located farthest from the mini-environment 103 when it is at a position that allows placement of the pod 1 onto it from the exterior (loading) or removal of the pod 1 from it (unloading), and closest to the mini-environment 103 when it is at a position that allows detachment of the lid 3 of the pod 1.

On the surface of the door 115a are provided suction pads 115k. The suction pads 115k are supplied with a negative pressure from a negative pressure source 108 (see FIG. 12) through pipes (not shown) when they are in contact with the lid 3, whereby the lid 3 is sucked by the suction pads 115k. Thus, the lid 3 can be held by the door 115a. The door system 115 includes a door arm 115b, a door opening and closing actuator 115c and a door elevator mechanism 115d. The door arm 115b is a rod-like member. The door arm 115b supports the door 115a at one end and is connected to the door opening and closing actuator 115c at the other end. The door arm 115b is pivotally supported by a pivot shaft at an appropriate intermediate position so as to be able to swing about that position. The door arm 115b is swung about the rotation center axis by the door opening and closing actuator 115c, whereby the end of the door arm 115b and the door 115a supported thereon are moved toward or away from the first opening 111. The door elevator mechanism 115d supports the door opening and closing actuator 115c and the pivot shaft of the door arm 115b and has a vertical movement actuator to move the actuator, the door arm 115b and the door 115a along the vertical direction along a guide extending in the vertical direction.

As shown in FIG. 11, a substantially annular seal member 115m is provided in the periphery of the surface of the door 115a that is opposed to the lid 3 so that the seal member 115m cooperates with a seal surface provided on the front surface 3b of the lid 3. In the state in which the lid 3 is held by suction by the suction pads 115k provided on the surface of the door 115a, the seal member 115m is in close contact with the seal surface 3c. Small dust particles or the like adhering on the front surface of the lid 3 are confined in a sealed space thus formed, whereby diffusion of dust particles to the environment is prevented. In this embodiment, the lid 3 is held only by the suction pads 115k. However, an evacuation port for suction may further be provided on the front surface of the door to evacuate the space that is defined by the door 115a, the lid 3 and the seal member 115m and sealed by the seal member 115m. In this case, small dust particles or the like can be removed positively, and the lid 3 can be held more firmly by the door 115a. Alternatively, the suction pads 115k may be eliminated, and the seal member 115m may be used as a kind of suction pad.

Figure 12:
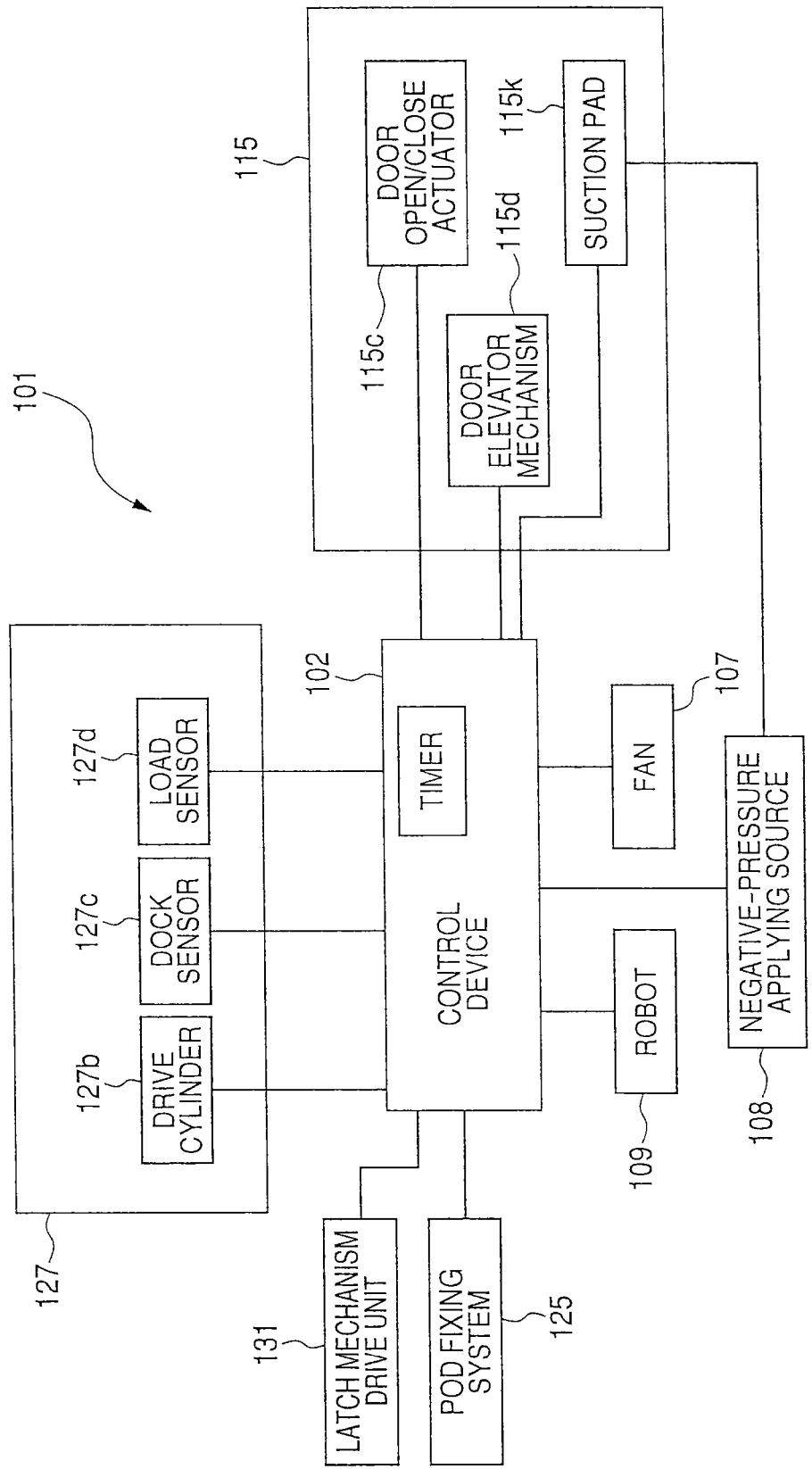
FIG. 12 is a block diagram showing the general configuration of the lid opening and closing system according to the embodiment of the present invention.

FIG. 12 is a block diagram showing the configuration of this FIMS system 101. The above described fan 107, robot 109, door system 115, pod fixing system 125 and docking plate drive system 127 are controlled by a control apparatus 102. The door closing and opening actuator 115c and the door elevator mechanism 115d in the door system 115 may be controlled independently from each other. However, in the actual operation, they are controlled in such a way that they operate according to a sequence time chart. The latch mechanism drive unit 131 is also controlled by the control apparatus 102 so as to operate in synchronization with the aforementioned operation sequence of the door system 115. Supply of negative pressure to the suction pads 115k from the negative pressure source 108 and shutting-off thereof (breaking of the negative pressure) are controlled by the control apparatus 102. The docking plate drive system 127 turns on and off the driving by the drive cylinder 127b. It is necessary to detect, with reliability, two predetermined positions of the docking plate 123 driven by the operation of the drive cylinder 127, namely the load position that allows placement of the pod 1 and the dock position that allows transfer of wafers from/into the pod 1.

For this purpose, to the docking plate drive system 127 is connected a load sensor 127d that detects placement of the pod 1 on the docking plate 123 and presence of the docking plate 123 at the position allowing loading and unloading the docking plate 123 with the pod 1. In addition, to the docking plate drive system 127 is also connected a dock sensor 127c that detects whether or not the docking plate 123 is present at the above described dock position. In the present invention, since the lid 3 has high stiffness and is hard to deform, and switching between engagement and disengagement of the latch mechanism is achieved by operation along only one axis, the possibility of failure of engagement of the latch mechanism 5 is much lower than that in conventional structures. In view of this, in this embodiment, an on/off signal indicative of the extended/retracted state of the rod is generated and supplied to the latch mechanism drive unit 131, and engagement and disengagement of the lid 3 and the pod body 2 are detected by this on/off signal.

In the following, the operation of the lid opening and closing system 101 in the actual wafer processing operation will be described. In the wafer processing operation, a pod 1 containing a predetermined number of wafers and filled with clean air is placed on the docking plate 123. When the pod 1 is placed on the docking plate 123, the pod fixing system 125 operates to achieve the prescribed position of the pod 1 on the docking plate 123. Thereafter, the docking plate drive system 127 operates to move the pod 1 toward the first opening 111. Specifically, the pod 1 that has been made integral with the docking plate 123 by the pod fixing system 125 is moved by driving the docking plate 123 by the drive cylinder 127b. During this operation, the door 115a is kept stationary at the position at which it substantially closes the first opening 111. The driving operation is completed when the lid 3 of the pod 1 abuts the abutment surface of the door 115a, and a prescribed positional relationship between the docking plate 123 and the first opening portion 111 is achieved. At this time, the latch mechanism drive units 131 and the latch mechanisms 5 are in the prescribed positional relationship as shown in FIG. 8A and other drawings. In this state, the latch mechanisms drive unit 131 start to operate, and engagement of the pod body 2 and the lid 3 is released. Simultaneously, the suction pads 115k suck the lid 3, whereby the lid 3 is held by the door 115a. In addition, the space formed between the front surface of the lid 3 and the surface of the door 115a is brought into a sealed state by the seal member 115m. The control apparatus 102 causes the door 115a and the latch mechanism drive unit 131 in such a way that the holding of the lid 3 by suction by the door 115a and the operation of disengagement of the latch mechanism 5 acting between the lid 3 and the pod body 2 by the latch mechanism drive unit 131 are performed synchronously.

In this state, the door opening and closing actuator 115c starts to operate. Thus, the door arm 115b swings to move the door 115a that is holding the lid 3 from the first opening 111 to the interior of the mini-environment 103. When the door arm 115b stops at a prescribed swing angle, the door elevator mechanism 115d starts to operate, whereby the door 115a is moved downward with the door opening and closing actuator 115c. By this operation, the first opening 111 is fully opened, and the mini-environment 103 is in communication with the interior of the pod body 2 via the first opening 111. In this state, the robot 109 starts to operate, and transfers wafers 4 from the interior of the pod 1 to the wafer processing apparatus 117 through the second opening 113, using the robot arm 109a. Furthermore, while this state is maintained, the robot 109 also transfers wafers that have undergone a certain processing in the interior of the wafer processing apparatus 117 into the interior of the pod 1. In the embodiment shown in FIGS. 6A and 6B, the control apparatus 102 causes the latch mechanism drive unit 131 to operate in synchronization with the completion of the movement of the lid 3 to a predetermined position with respect to the pod body 2 caused by the door 115a (i.e. in synchronization with the completion of the movement of the roller portion 5b into the first straight portion 3c1). Thus, the operation of pushing the lid 3 by the roller portions 5b shown in FIG. 7A or 7B can be performed with reliability.

The process of attaching the lid 3 to the pod 1 to allow detachment of the pod 1 from the lid opening/closing system 101 is performed basically by reversing the above-described operations. In this process, the aforementioned cylinder sensor operates during the process of fixing the lid 3 to the pod body 2 to detect whether or not the latch mechanism drive unit 131 has driven the latch mechanism 5 to an appropriate position. More specifically, the cylinder sensor operates to verify that the engagement portion 5b of the latch mechanism 5 is located at a position on or in the vicinity of the closed end 3c4 of the engaged recess 3c to achieve a specific engagement state. In this way, it is verified that the specific engagement state of the lid 3 and the pod 2 has been established. Thereafter, the operation of unloading the pod 1 is performed. Through the above-described operations, the lid 3 is fixedly attached to the pod body 2 with reliability. Therefore, for example, the dropping-off of the lid 3 during the transportation of the pod mentioned before can be prevented from occurring.

By using the FIMS system or the lid opening/closing system described above, it is possible to detect whether or not the lid is fixed to the pod body securely and to prevent various problems, such as detachment of the lid from the pod during the transportation of the pod, caused by an unsatisfactory latching state. The system according to this embodiment is for use with a pod that is provided with the latch main body 5a that can move along an axis relative to the pod body and the roller portion 5b or the engagement portion projecting from the latch main body 5a, and the lid 3 is provided with the engaged recess 3c so that engagement of the engagement portion 5b with the engaged recess 3c and disengagement therefrom are achieved by the movement of the latch main body 5a along the axis. The actuator adapted to move the latch main body 5a along the axis has the function of a sensor to detect the engagement status of the pod body and the lid. In this embodiment, the lid opening/closing system is provided with means for detecting the latch status (i.e. a cylinder sensor) adapted for the pod having a structure that enables simpler and more reliable latching as compared to conventional pods, whereby reliable engagement and disengagement of the latch mechanism can be achieved advantageously with a simple structure as well as prevention of deformation of the lid thanks to the structure of the pod and improvement in the reliability of latching. Although the latch mechanism drive unit 131 is adapted to have the function of a cylinder sensor in this embodiment, an engagement portion position detection sensor and a latch drive unit serving as the latch mechanism drive means may be provided as separate components.

(Second Embodiment)

In the case of the pod to which the present invention is applied, since the structure of the lid is simple, the lid 3 is received in the receiving recess 2d in the pod reliably by the ordinary operation of the door. However, there may be cases where the lid 3 is not pushed to a satisfactory position in the receiving recess 2d due to, for example, a trouble with the door drive mechanism. In such cases also, in the case of the above-described first embodiment, the latch mechanism 5 can perform an ordinary latching operation even if the lid 3 is not located at a predetermined position, and a signal indicative of the completion of the latching operation can be generated. This problem is addressed to in the second embodiment described in the following. FIGS. 13A to 13D are diagrams illustrating the second embodiment. FIG. 13A to 13D are enlarged, partly see-through views showing the relevant portion including the flange portion 2c of the pod, the link portion 5c and the roller portion 5b in the latch mechanism, and the side surface and the engaged recess 3c of the lid 3 as seen from the direction same as FIG. 9. The lid 3 used in this embodiment is one having an engaged recess 3c shown in FIG. 6B.

Figure 13A:
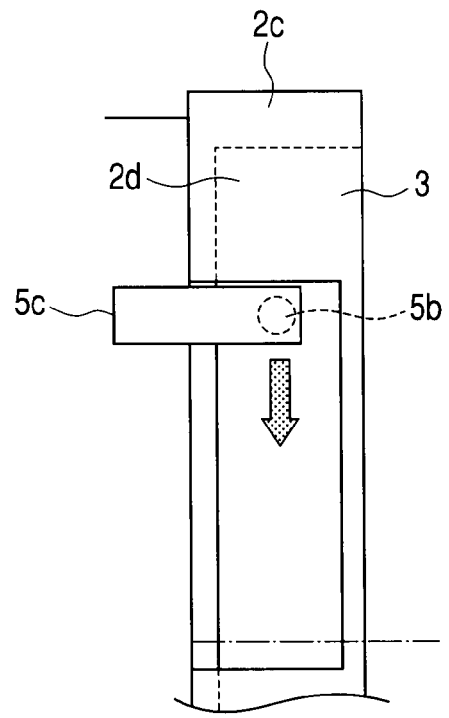
FIG. 13A is a diagram illustrating a way of detecting the state of attachment of the lid to the pod body in a lid opening/closing system according to a second embodiment of the present invention.
Figure 13B:
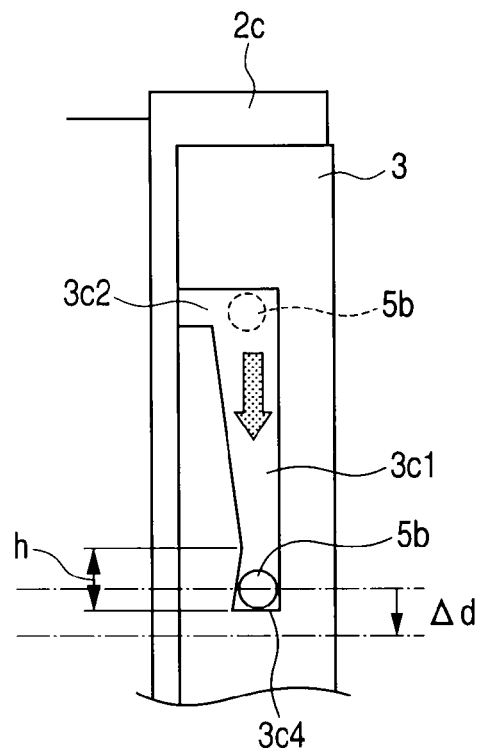
FIG. 13B is a diagram illustrating the way of detecting the state of attachment of the lid to the pod body in the lid opening/closing system according to the second embodiment of the present invention.

In this embodiment, the drive stroke of the cylinder sensor (i.e. the latch mechanism drive unit 131) or the range of movement of the corresponding roller portion 5b is designed to be larger than the length of the engaged recess 3c along the longitudinal direction (i.e. the length along the drive axis direction along which the latch main body 5a extends). In the state shown in FIG. 13A, the lid 3 is received in the receiving recess 2d at a predetermined position relative to the pod body 2. In this state, normally, the roller portion 5b is received in the engaged recess 3c. Then, the roller portion 5b and other components are driven downwardly (to the engagement position) by the latch mechanism drive unit 131 as indicated by the arrow in FIG. 13A. FIG. 13B shows the movement of the roller portion 5b in the normal process of fixing the lid 3. The roller portion 5b moves from the joining portion of the first straight portion 3c1 and the second straight portion 3c2 toward the closed end 3c4 and abuts and stops at the closed end 3c4.

Figure 13C:
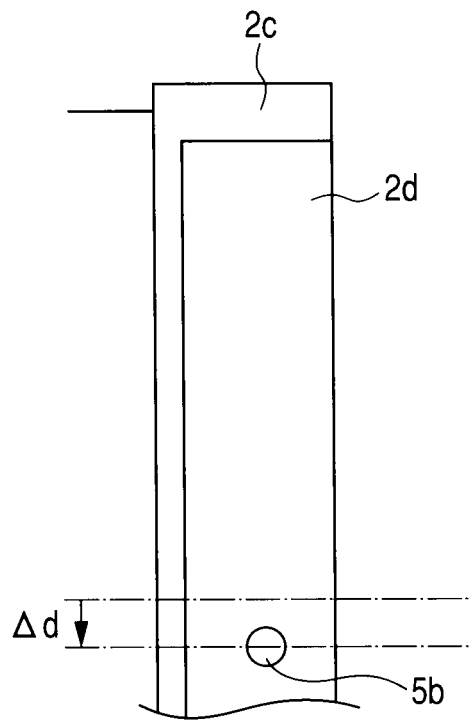
FIG. 13C is a diagram illustrating the way of detecting the state of attachment of the lid to the pod body in the lid opening/closing system according to the second embodiment of the present invention.
Figure 13D:
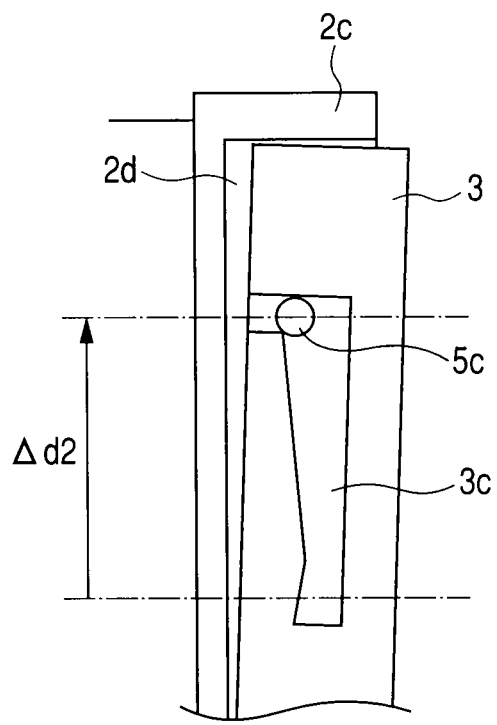
FIG. 13D is a diagram illustrating the way of detecting the state of attachment of the lid to the pod body in the lid opening/closing system according to the second embodiment of the present invention.

The lower end of the movable range of the roller portion 5b is designed to be at a position lower than the closed end 3c4 by a certain distance Δd, for example, in the case where the latch mechanism drive unit 131 operates at a time when the lid 3 is not received in the receiving recess 2d. In other words, one end of the movable range of the latch mechanism drive unit 131 and the latch main body 5a driven by it is designed to correspond to the position of the open end of the second straight portion 3c2 and the other end thereof is designed to correspond to a position more distant from the second straight portion 3c2 than the closed end 3c4. Therefore, the roller portion 5b can move beyond the normal stop position by the distance Δd as shown in FIG. 13C. There may be cases in which the lid is not received in the receiving recess 2d in an appropriate position. More specifically there may be cases in which the lid 3 is received in the receiving recess in a tilted manner. In such cases, the roller portion 5b will abut the inner surface of the first straight portion 3c1 on its way to the closed end 3c4 and stop at that position, if the first straight portion 3c1 has an appropriate width as shown in FIG. 13D. In other words, the roller portion 5b cannot move over the predetermined distance Δd2.

Therefore, if a signal generated by the cylinder sensor indicates that the roller portion 5b is located at the predetermined stopping position, namely at the closed end 3c4, or that the roller portion 5b is located within a predetermined distance range h from the closed end 3c4, it may be concluded that a satisfactory latching state has been achieved. On the other hand, if the roller portion 5b has moved beyond the predetermined position or range, it may be concluded that the lid 3 is not present in the receiving recess 2d. In the other cases, it may be concluded that the lid 3 is not attached to the pod body 2 in an appropriate state. According to this embodiment, the movable range of the engagement portion 5b of the latch mechanism 5 or the operation range of the latch mechanism drive unit 131 is arranged to be larger than the length of the first straight portion, and the fixing status of the lid 3 on the pod body 2 can be detected with improved reliability by the control apparatus 102 (see FIG. 12) based on a signal indicative of a section in which the roller portion 5b is located, generated by the cylinder sensor. Thus, the movable range of the roller portion 5b is divided into the aforementioned three sections, and a detection signal indicative of the section in which the roller portion 5b is located is generated, whereby the cases where the lid 3 is not present, cases where the lid 3 is about to be attached in a tilted manner, and cases where the lid 3 is about to be attached in an appropriate manner can be discriminated. More specifically, it is preferred that use is made of a cylinder sensor that can generate a first signal indicating that the roller portion 5b is located at the closed end 3c4 or within a specific distance range from the closed end 3c4 toward the second straight portion 3c2, a second signal indicating that the roller portion 5b is located within the range from the closed end 3c4 to the other end of its movable range, and a third signal indicating that the roller portion 5b is located in the other range.

(Third Embodiment)

Figure 14A:
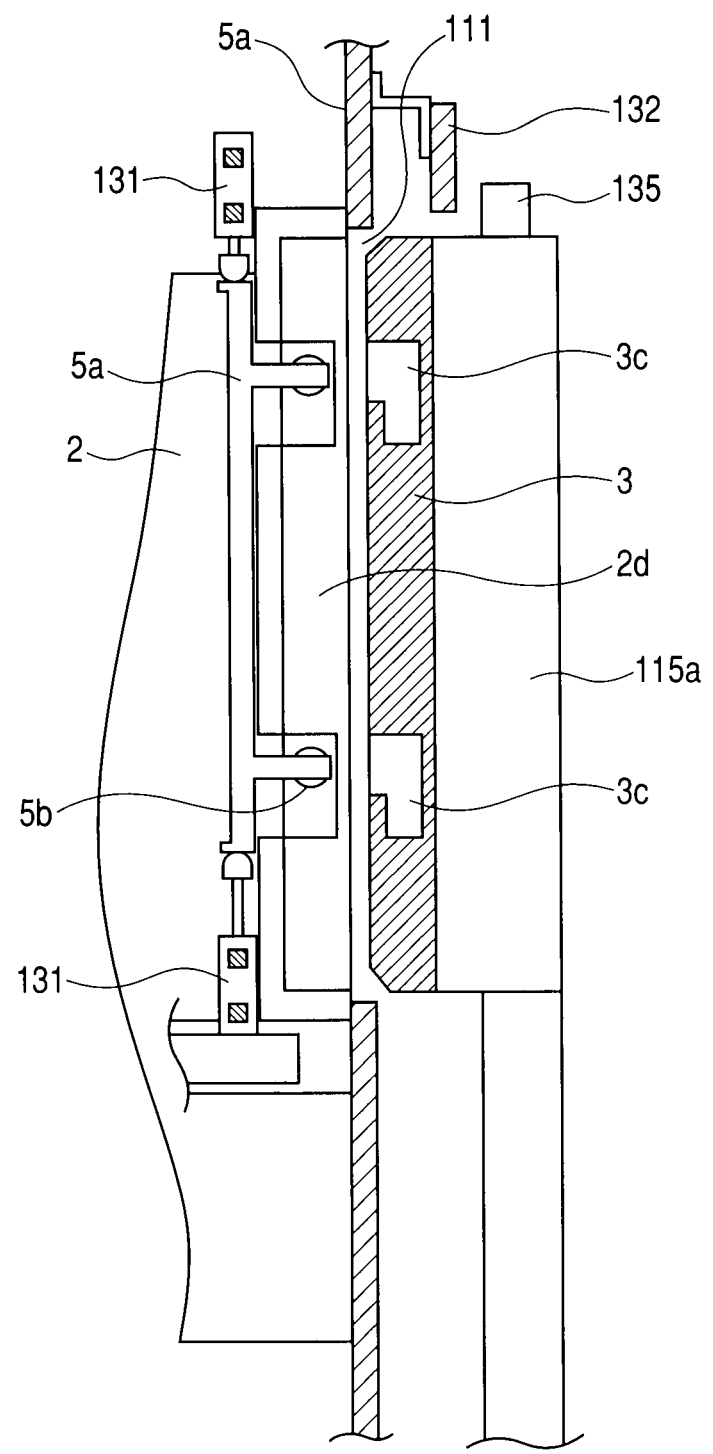
FIG. 14A is a diagram illustrating a way of detecting the state of attachment of the lid to the pod body in a lid opening/closing system according to a third embodiment of the present invention.

In the second embodiment described above, whether the position of the lid 3 with respect to the pod body 2 is appropriate or not is detected by the cylinder sensor alone. However, another sensor may be provided in addition to the cylinder sensor to detect whether the position of the lid 3 is appropriate or not. Such a mode of the invention will be described in the following as the third embodiment. FIGS. 14A to 14D show sequential steps of the latching operation in this embodiment. FIGS. 14A to 14D are enlarged, partly see-through showing the components in the vicinity of the first opening portion 111 shown in FIG. 9 in a manner similar to FIG. 9. As shown in FIG. 14A, the system according to this embodiment has a photo sensor 132 provided above the first opening portion 111 provided on the housing wall 5a of the mini-environment. In addition, a sensor dog 135 serving as an object to be detected by the photo sensor 132 is provided on the upper surface (i.e. the surface opposed to the upper wall that defines the first opening portion 111) of the door 115a.

Figure 14B:
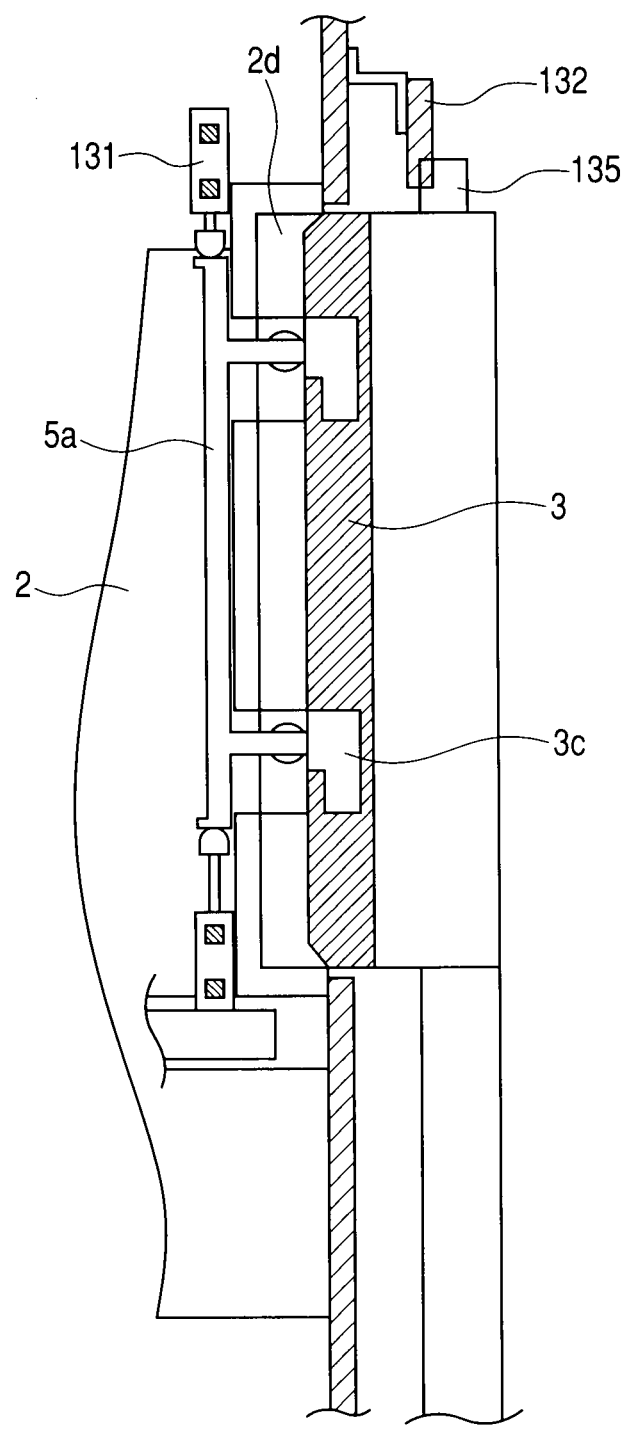
FIG. 14B is a diagram illustrating the way of detecting the state of attachment of the lid to the pod body in the lid opening/closing system according to the third embodiment of the present invention.
Figure 14C:
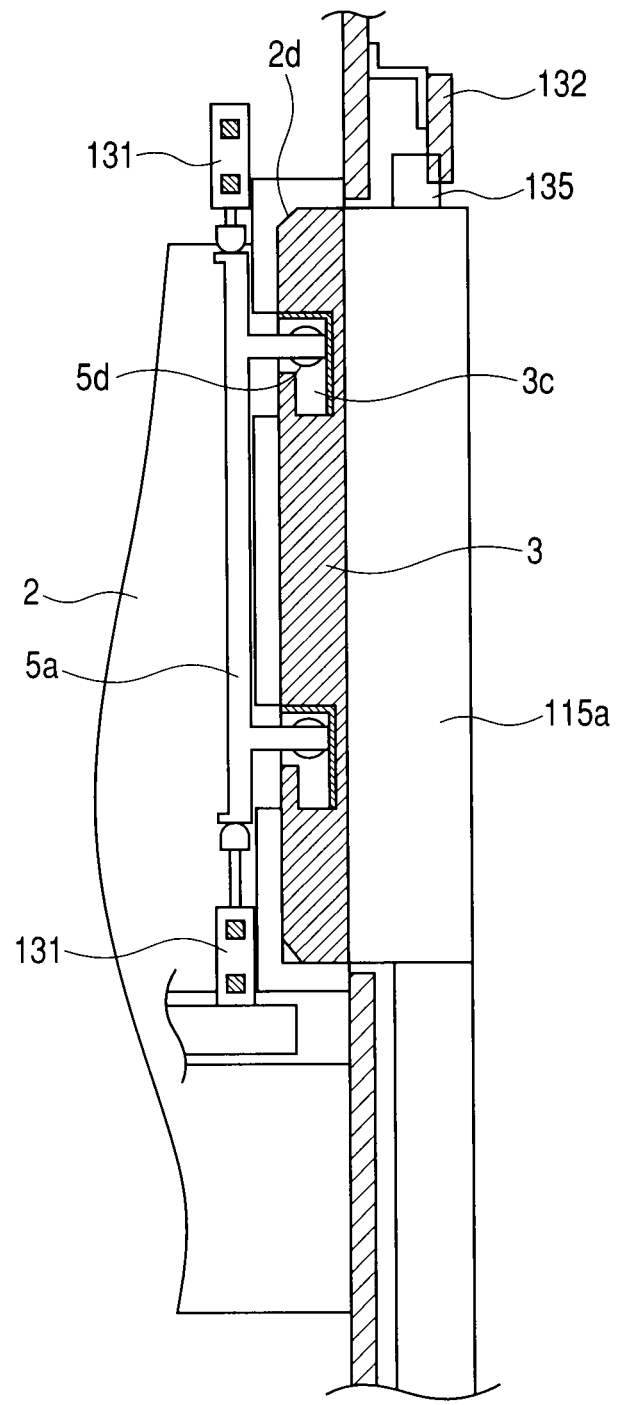
FIG. 14C is a diagram illustrating the way of detecting the state of attachment of the lid to the pod body in the lid opening/closing system according to the third embodiment of the present invention.
Figure 14D:
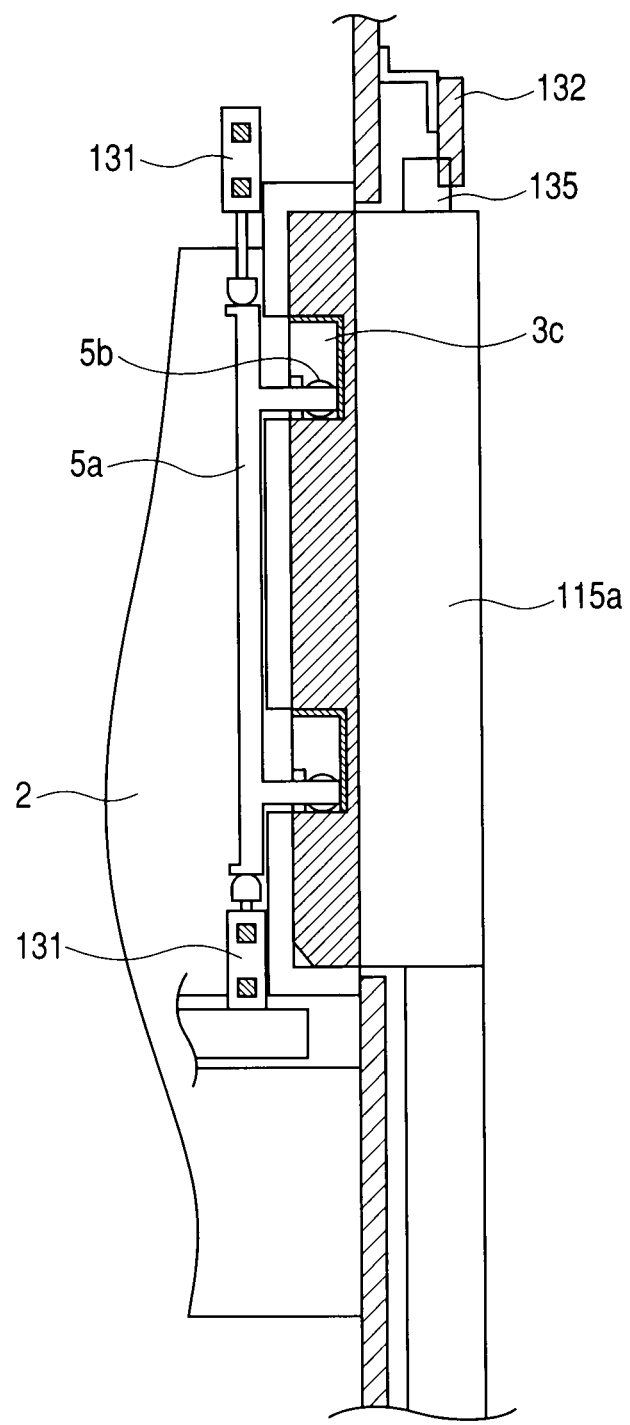
FIG. 14D is a diagram illustrating the way of detecting the state of attachment of the lid to the pod body in the lid opening/closing system according to the third embodiment of the present invention.

In the following, the operation of fixing the lid to the pod body 2 performed with the above-described components will be described. As shown in FIG. 14A, the lid 3 held by the door 115a is moved to a position at which it is directly opposed to the receiving recess 2d of the pod body 2. At this stage, the latch mechanism drive unit 131 keeps the latch mechanism 5 stationary at a position at which it does not engage with the lid 3. The sensor dog 135 is located at a position out of the detection area of the photo sensor 132. Then, as the door 115a moves toward the first opening portion 111 from the above-described position, a portion of the lid 3 starts to be received in the receiving recess 2d, as shown in FIG. 14B. At this stage, a part of sensor dog 135 is detected by the photo sensor 132. The door 115a further moves until the lid 3 is received in the receiving recess 2d by a predetermined amount, and the movement of the door is stopped when the lid 3 abuts the bottom wall of the receiving recess 2d, as shown in FIG. 14C. During this process, the sensor dog 135 passes through the detection area of the photo sensor 132, and a specific positional relationship between them is met at the time when the movement of the door 115a stops. With the above-described operation, it is verified by the photo sensor 132 that the door 115a and the lid 3 held by it have moved to a predetermined position. Thereafter, the latch drive unit 131 starts to operate to move the latch mechanism 5 to a position at which it engages with the lid 3, as shown in FIG. 14D.

According to this embodiment, the operation state of the latch mechanism is detected by the cylinder sensor, and the presence/absence of the lid is detected by the combination of the photo sensor and the sensor dog. The status of engagement of the lid 3 on the pod body 2 can be detected by the combination of them. In this embodiment, the cylinder sensor functions as the engagement portion position detection sensor, and the combination of the photo sensor and the sensor dog functions as the door position detection sensor. The sensors are not limited to those described herein, and various modifications may be made thereto as long as the above-described functions are achieved by a sensor or sensing system. The sensor dog may be disposed at any position corresponding to the photo sensor, and the photo sensor may be disposed at any position without particular limitations as long as it can detect the position of the door in the vicinity of its final position in the operation of fixing the lid to the pod body. In the case of this embodiment, it is not easy to detect, for example, the fact that the lid 3 is received in the receiving recess 2d in a tilted manner. To enable this, the photo sensor 132 may be adapted to be turned off when the door 115a comes to the frontmost position in its movable range. In cases where the lid 3 is tilted, the door 115a cannot move to the frontmost position in the movable range. Therefore, it is possible to know whether the lid 3 is tilted or not by checking whether or not the signal from the photo sensor once turns on and thereafter turns off. To sum up, use may be made of any door position detection sensor that can generate a first door position signal indicating that a predetermined relationship between the lid 3 and the opening 2a of the pod body 2 has been achieved, and a second door position signal indicating that the lid 3 is in close contact with the pod body 2 to close the opening 2a of the pod body 2.

The above description of the embodiment has been directed mainly to an FIMS system for wafers. However, the applications of the invention are not limited to that system, but the present invention can also be applied to closed containers for storing display panels, optical disks or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A lid opening/closing system for a closed container including a lid having a flat plate shape and having plural engaged portions, a container body having an opening to be closed by said lid and an interior space that opens at said opening, and a latch mechanism including plural latch main bodies, each latch main body can move along an axis relative to said container body, and plural engagement portions, each of which plural engagement portions projects from each of the latch main bodies, is provided for a corresponding one of said engaged portions and can engage with said corresponding engaged portion, for fixing the lid to said container body by the engagement of each of said engagement portions with said corresponding engaged portion, said system being adapted to fix said lid to said closed container by causing the latch main bodies to move along said axes, said system comprising:

a housing that defines a mini-environment having an opening portion;

a door that can move between a position at which the door substantially closes said opening portion and a position at which the door leaves said opening portion open, and can hold said lid;

a latch mechanism drive device that can operate said latch mechanism when said closed container is at a position at which opening and closing of said lid by said door is performed, said latch mechanism drive device being capable of moving said latch main bodies between an engaged position at which each of said engagement portions engages with said corresponding engaged portion and a released position at which each of said engagement portions does not engage with said corresponding engaged portion, and being fixedly disposed on said housing independent from said container body and said door, wherein the latch mechanism drive device moves each of the latch main bodies along the axes independently from the container body; and an engagement portion position detection sensor that detects the moving position of at least one of said engagement portions that changes with the movement of said latch main bodies along said axes caused by said latch mechanism drive device.

2. A lid opening/closing system according to claim 1, wherein said container body has a flange portion that extends from the periphery of said opening parallel to a surface at which said opening is formed and forms a receiving recess in which said lid is received in a state in which said opening is closed by said lid and plural insertion holes, each of which passes from an outer surface of said flange portion to said receiving recess, is provided for a corresponding one of said engaged portions, and is provided at a position aligned with said corresponding engaged portion in a state in which said lid is received in said receiving recess, said latch main bodies can move along the axes and parallel to said surface at which said opening is formed, each of said engagement portions reaches said receiving recess through said respective insertion hole, each of said engagement portions can engage with said corresponding engaged portion of said lid disposed in said receiving recess, and engagement of each said engagement portion and said corresponding engaged portion and release of the engagement are achieved by movement of said latch main bodies along said axes.

3. A lid opening/closing system according to claim 1, further comprising a door position detection sensor that detects the position of said door to thereby detect the distance between said lid held by said door and said container body, which changes depending on the position of said door.

4. A lid opening/closing system according to claim 3, wherein said door position detection sensor comprises a photo sensor disposed in the vicinity of said opening portion in said mini-environment and a sensor dog disposed at a position corresponding to said photo sensor on the outer circumference of said door.

5. A lid opening/closing system according to claim 3, wherein said door position detection sensor can generate a first door position signal indicating that said lid and the opening of said container body are in a specific positional relationship and a second door position signal indicating that said lid is in close contact with said container body to close said opening.

6. A lid opening/closing system for a closed container including a lid having a flat plate shape formed by a front surface and a rear surface opposed to the front surface and having plural engaged portions each having a groove shape which opens at the rear surface of said lid and is formed on an outer periphery surface connecting with both said front surface and said rear surface, a container body having an opening to be closed by said lid and an interior space that opens at said opening, and a latch mechanism including plural latch main bodies, each latch main body can move along an axis relative to said container body, and plural engagement portions, each of which plural engagement portions projects from each of the latch main bodies, is provided for a corresponding one of said engaged portions and can engage with said corresponding engaged portion, for fixing the lid to said container body by the engagement of each of said engagement portion with said corresponding engaged portion, said system being adapted to fix said lid to said closed container by causing the latch main bodies to move along said axes, said system comprising:

a housing that defines a mini-environment having an opening portion;

a door that can move between a position at which the door substantially closes said opening portion and a position at which the door leaves said opening portion open, and can hold said lid;

a latch mechanism drive device that can operate said latch mechanism when said closed container is at a position at which opening and closing of said lid by said door is performed, said latch mechanism drive device being fixedly disposed in the vicinity of said opening portion outside said housing, and independent from said door, wherein the latch mechanism drive device moves each of the latch main bodies along the axes independently from the container body; and an engagement portion position detection sensor that detects the moving position of at least one of said engagement portions that changes with the movement of said latch main bodies along said axes caused by said latch mechanism drive device.

7. A lid opening/closing system according to claim 6, wherein said container body has a flange portion that extends from the periphery of said opening parallel to a surface at which said opening is formed and forms a receiving recess in which said lid is received in a state in which said opening is closed by said lid and plural insertion holes each of which passes from an outer surface of said flange portion to said receiving recess and is provided at a position aligned with a corresponding one of said engaged portions in a state in which said lid is received in said receiving recess, said latch main bodies can move along the axes and parallel to said surface at which said opening is formed, each said engagement portion reaches said receiving recess through said respective insertion hole, each of said engagement portions can engage with said corresponding engaged portion of said lid disposed in said receiving recess, and engagement of each said engagement portion and said corresponding engaged portion and release of the engagement are achieved by movement of said latch main bodies along said axes.

8. A lid opening/closing system according to claim 6, further comprising a door position detection sensor that detects the position of said door to thereby detect the distance between said lid held by said door and said container body, which changes depending on the position of said door.

9. A lid opening/closing system according to claim 8, wherein said door position detection sensor comprises a photo sensor disposed in the vicinity of said opening portion in said mini-environment and a sensor dog disposed at a position corresponding to said photo sensor on the outer circumference of said door.

10. A lid opening/closing system according to claim 8, wherein said door position detection sensor can generate a first door position signal indicating that said lid and the opening of said container body are in a specific positional relationship and a second door position signal indicating that said lid is in close contact with said container body to close said opening.

11. A lid opening/closing system for a closed container including a lid having a flat plate shape and having plural engaged portions, a container body having an opening to be closed by said lid, an interior space that opens at said opening, and a receiving recess which is provided between said opening and an exterior space, is capable of receiving said lid at the time of closing said opening, and is separated from said interior space by said lid, and a latch mechanism, including plural latch main bodies, each latch main body can move along an axis relative to said container body, and plural engagement portions, each of which plural engagement portions is provided for a corresponding one of said engaged portions, is in a state of projecting from each of the latch main bodies into said receiving recess and can engage with said corresponding engaged portion by a movement of said latch main bodies along said axes, for fixing the lid to said container body by the engagement of each said engagement portion with said corresponding engaged portion, said system being adapted to fix said lid to said closed container by causing the latch main bodies to move along said axes, said system comprising:
- a housing that defines a mini-environment having an opening portion;
- a door that can move between a position at which the door substantially closes said opening portion and a position at which the door leaves said opening portion open, and can hold said lid;
- a latch mechanism drive device that can operate said latch mechanism when said closed container is at a position at which opening and closing of said lid by said door is performed, said latch mechanism drive device being fixedly disposed in the vicinity of said opening portion outside said housing and independent from said door, wherein the latch mechanism drive device moves each of the latch main bodies along the axes independently from the container body; and
- an engagement portion position detection sensor that detects the moving position of at least one of said engagement portions that changes with the movement of said latch main bodies along said axes caused by said latch mechanism drive device.

12. A lid opening/closing system according to claim 11, wherein
- said container body has a flange portion that extends from the periphery of said opening parallel to a surface at which said opening is formed and forms said receiving recess in which said lid is received in a state in which said opening is closed by said lid and plural insertion holes each of which passes from an outer surface of said flange portion to said receiving recess and is provided at a position aligned with a corresponding one of said engaged portions in a state in which said lid is received in said receiving recess, said latch main bodies can move along the axes and parallel to said surface at which said opening is formed, one of said engagement portions reaches said receiving recess through said respective insertion hole,
- each of said engagement portions can engage with said engaged portion of said lid disposed in said receiving recess, and engagement of each said engagement portion and said corresponding engaged portion and release of the engagement are achieved by movement of said latch main bodies along said axes.

13. A lid opening/closing system for a closed container including a lid having a flat plate shape and having plural engaged portions, a container body having an opening to be closed by said lid and an interior space that opens at said opening, and a latch mechanism including plural latch main bodies, each latch main body can slide along an axis relative to said container body and plural engagement portions, each of which plural engagement portions projects from each of the latch main bodies, is provided for a corresponding one of said engaged portions and can engage with said corresponding engaged portion, for fixing the lid to said container body by the engagement of one of said engagement portions with said corresponding engaged portion, said system being adapted to fix said lid to said closed container by causing the latch main bodies to move along said axes, said system comprising:
- a housing that defines a mini-environment having an opening portion;
- a door that can move between a position at which the door substantially closes said opening portion and a position at which the door leaves said opening portion open, and can hold said lid;
- a latch mechanism drive device that can operate said latch mechanism when said closed container is at a position at which opening and closing of said lid by said door is performed, said latch mechanism drive device being fixedly disposed in the vicinity of said opening portion outside said housing and independent from said door; and
- an engagement portion position detection sensor that detects the moving position of at least one of said engagement portions that changes with the movement of said latch main bodies along said axes caused by said latch mechanism drive device, wherein
- each of said engaged portions has an L-shape including a first straight portion that extends along a direction in which an outer peripheral surface of said flat plate shape of said lid extends and is closed at one end thereof to form a closed end, and a second straight portion that has an open end on one side of said flat plate shape, joins to the other end of said first straight portion, and extends along a thickness direction of said lid, and
- one end of a movable range over which each of said engagement portions is moved by said latch mechanism drive device corresponds to the open end of said second straight portion, and another end of the movable range corresponds to a position more distant from said second straight portion than the closed end of said first straight portion.

14. A lid opening/closing system according to claim 13, further comprising plural engagement portion position detection sensors, wherein said engagement portion position detection sensor can generate a first signal indicating that at least one of said engagement portions is located at said closed end or in a range from said closed end to a position at a specific distance from said closed end toward the second straight portion, a second signal indicating that at least one of said engagement portions is located in another range from said closed end to the another end of the movable range of said engagement portion, and a third signal indicating that at least one of said engagement portions is located in yet a further range.

* * * * *